US010825380B2

(12) United States Patent
Kim et al.

(10) Patent No.: US 10,825,380 B2
(45) **Date of Patent: *Nov. 3, 2020**

(54) DISPLAY PANEL INCLUDING INORGANIC LIGHT EMITTING DEVICE AND METHOD FOR DRIVING THE DISPLAY PANEL

(71) Applicant: SAMSUNG ELECTRONICS CO., LTD., Suwon-si (KR)

(72) Inventors: Jinho Kim, Suwon-si (KR); Kisun Kang, Suwon-si (KR); Sangmin Shin, Suwon-si (KR); Hoseop Lee, Suwon-si (KR); Youngki Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

This patent is subject to a terminal disclaimer.

(21) Appl. No.: 16/263,901

(22) Filed: Jan. 31, 2019

(65) Prior Publication Data

US 2019/0371231 A1 Dec. 5, 2019

(30) Foreign Application Priority Data

May 31, 2018 (KR) ........................ 10-2018-0063098
Aug. 21, 2018 (KR) ........................ 10-2018-0097414

(51) Int. Cl.
*G09G 3/32* (2016.01)
*G09G 3/20* (2006.01)
*H01L 27/15* (2006.01)

(52) U.S. Cl.
CPC ............. *G09G 3/32* (2013.01); *G09G 3/2003* (2013.01); *G09G 3/2011* (2013.01);
(Continued)

(58) Field of Classification Search
CPC ...... G09G 3/32; G09G 3/2003; G09G 3/2014; G09G 3/2011; G09G 2300/426;
(Continued)

(56) References Cited

U.S. PATENT DOCUMENTS 5,206,633 A 4/1993 Zalph
5,561,441 A 10/1996 Hamano
(Continued)

FOREIGN PATENT DOCUMENTS

JP 2013-232419 A 11/2013
KR 10-0914929 B1 9/2009
(Continued)

OTHER PUBLICATIONS

International Search Report (PCT/ISA/210) dated May 17, 2019, issued by International Searching Authority in International Application No. PCT/KR2019/001359.
(Continued)

*Primary Examiner* — Laurence J Lee
(74) *Attorney, Agent, or Firm* — Sughrue Mion, PLLC

(57) ABSTRACT

A display panel includes a glass, an inorganic light emitting device included in a sub pixel of the display panel, and a driving circuit disposed between the glass and the inorganic light emitting device such that the inorganic light emitting device is mounted on and electrically connected to the driving circuit. The driving circuit is configured to control an amplitude and a pulse width of a driving current provided to the inorganic light emitting device. The amplitude and pulse width of the driving current may be corrected according to a deviation in the driving circuit.

20 Claims, 14 Drawing Sheets

300
Data
5
321
VDD
320
310
PAM DRIVING CIRCUIT
325
330
PWM DRIVING CIRCUIT
Sense
340
200
322
VSS

(52) U.S. Cl.
CPC ......... *G09G 3/2014* (2013.01); *H01L 27/156* (2013.01); *G09G 2300/043* (2013.01); *G09G 2300/0426* (2013.01); *G09G 2300/0452* (2013.01); *G09G 2310/08* (2013.01); *G09G 2320/0633* (2013.01); *G09G 2320/0666* (2013.01)

(58) Field of Classification Search
CPC ....... G09G 2320/0633; G09G 2310/08; G09G 2300/0452; G09G 2300/043; G09G 2320/0666; H01L 27/156; H01L 33/62; H01L 25/0753
See application file for complete search history.

(56) References Cited

U.S. PATENT DOCUMENTS

| | | | | |
|---|---|---|---|---|
| 7,167,169 | B2 | 1/2007 | Libsch et al. | |
| 7,623,123 | B2 | 11/2009 | Kim | |
| 7,675,249 | B2 | 3/2010 | Furukawa et al. | |
| 7,781,979 | B2 | 8/2010 | Lys | |
| 7,808,497 | B2 | 10/2010 | Lo et al. | |
| 8,289,349 | B2 | 10/2012 | Kobayashi | |
| 9,099,045 | B2 | 8/2015 | Ueda et al. | |
| 10,504,406 | B2 | 12/2019 | Shigeta et al. | |
| 2005/0168417 | A1 | 8/2005 | Ha et al. | |
| 2006/0158396 | A1 | 7/2006 | Jo | |
| 2006/0290718 | A1 | 12/2006 | Ishida | |
| 2008/0007496 | A1 * | 1/2008 | Kim | G09G 3/3266 345/80 |
| 2008/0218469 | A1 | 9/2008 | Kwok et al. | |
| 2009/0021178 | A1 | 1/2009 | Furukawa et al. | |
| 2009/0115703 | A1 | 5/2009 | Cok | |
| 2010/0188443 | A1 | 7/2010 | Lewis et al. | |
| 2010/0309100 | A1 | 12/2010 | Cok et al. | |
| 2011/0279444 | A1 | 11/2011 | Chung et al. | |
| 2011/0298820 | A1 | 12/2011 | Hajjar | |
| 2012/0086734 | A1 | 4/2012 | Kitani et al. | |
| 2012/0113083 | A1 | 5/2012 | Kim et al. | |
| 2012/0169777 | A1 | 7/2012 | Budni et al. | |
| 2013/0009938 | A1 | 1/2013 | Hwang et al. | |
| 2014/0362062 | A1 | 12/2014 | Limketkai et al. | |
| 2016/0139416 | A1 * | 5/2016 | Yamakawa | G02B 27/102 359/634 |
| 2017/0263183 | A1 | 9/2017 | Lin et al. | |
| 2018/0014371 | A1 | 1/2018 | Wey | |
| 2018/0151132 | A1 | 5/2018 | Lee et al. | |
| 2018/0182279 | A1 | 6/2018 | Sakariya et al. | |
| 2018/0301080 | A1 | 10/2018 | Shigeta et al. | |
| 2019/0304386 | A1 | 10/2019 | Kim et al. | |
| 2019/0371231 | A1 | 12/2019 | Kim et al. | |
| 2019/0371232 | A1 | 12/2019 | Kim et al. | |

FOREIGN PATENT DOCUMENTS

| | | | |
|---|---|---|---|
| KR | 10-0922617 | B1 | 10/2009 |
| KR | 10-2015-0015637 | A | 2/2015 |
| KR | 10-1524308 | B1 | 5/2015 |
| KR | 10-2018-0002786 | A | 1/2018 |
| WO | 2018053025 | A1 | 3/2018 |

OTHER PUBLICATIONS

Written Opinion (PCT/ISA/237) dated May 17, 2019, issued by the International Searching Authority in International Application No. PCT/KR2019/001359.

International Search Report (PCT/ISA/210) dated Jul. 3, 2019, issued by International Searching Authority in International Application No. PCT/KR2019/001343.

Written Opinion (PCT/ISA/237) dated Jul. 3, 2019, issued by the International Searching Authority in International Application No. PCT/KR2019/001343.

International Search Report (PCT/ISA/210) dated Jul. 3, 2019, issued by International Searching Authority in International Application No. PCT/KR2019/001357.

Written Opinion (PCT/ISA/237) dated Jul. 3, 2019, issued by the International Searching Authority in International Application No. PCT/KR2019/001357.

Notice of Allowance dated Mar. 2, 2020, issued by the United States Patent and Trademark Office in U.S. Appl. No. 16/263,271.

Notice of Allowance dated Mar. 4, 2020, issued by the United States Patent and Trademark Office in U.S. Appl. No. 16/263,253.

* cited by examiner

DISPLAY PANEL INCLUDING INORGANIC LIGHT EMITTING DEVICE AND METHOD FOR DRIVING THE DISPLAY PANEL

CROSS-REFERENCE TO RELATED APPLICATIONS

This application is based on and claims priority under 35 U.S.C. § 119 to Korean Patent Application No. 10-2018-0063098, filed on May 31, 2018 and Korean Patent Application No. 10-2018-0097414, filed on Aug. 21, 2018, in the Korean Intellectual Property Office, the disclosures of which are incorporated by reference herein in their entirety.

BACKGROUND

1. Field

The disclosure relates to a display panel and a method for driving the display panel. More particularly, the disclosure relates to a display panel in which light emitting devices are included in a pixel, and a method for driving the display panel.

2. Description of Related Art

In related art, a display panel driving an inorganic light emitting device (hereinafter referred to as "LED") such as a red LED, a green LED, and a blue LED, as a sub pixel expresses a grayscale or gradation of the sub pixel by means of an amplitude of a driving current.

In this case, a wavelength as well as a grayscale or gradation of light emitted is shifted together according to an amplitude of the driving current, and thereby a color reproducibility of an image is reduced. FIG. 1 illustrates wavelength shifts according to a magnitude (or amplitude) of a driving current flowing through a blue LED, a green LED, and a red LED.

The above information is presented as background information only to assist with an understanding of the disclosure. No determination has been made, and no assertion is made, as to whether any of the above might be applicable as prior art with regard to the disclosure.

SUMMARY

Provided is a display panel including a driving circuit to control an LED which is an inorganic light emitting device mounted on a glass substrate to be stably operated.

Further, provided is a display panel including a driving circuit appropriate for a high-density integrated circuit by optimizing a design of a driving circuit driving an LED which is an inorganic light emitting device mounted on a glass substrate.

Further still, provided are a display panel that improves color reproducibility to an input image signal through an LED which is an inorganic light emitting device mounted on a glass substrate, and a display apparatus including the display panel.

In accordance with an aspect of the disclosure, a display panel includes a glass; an inorganic light emitting device; and a driving circuit disposed between the glass and the inorganic light emitting device, the driving circuit being configured to provide a driving current to the inorganic light emitting device and to control an amplitude and a pulse width of the driving current, wherein the inorganic light emitting device is mounted on the driving circuit and electrically connected to the driving circuit.

The display panel may further include a plurality of pixels arranged in a matrix form, each pixel from among the plurality of pixels including an R sub pixel including a red (R) inorganic light emitting device, a G sub pixel including a green (G) inorganic light emitting device, and a B sub pixel including a blue (B) inorganic light emitting device; and a plurality of driving circuits configured to provide driving current to each of the respective red, green, and blue inorganic light emitting devices included in the respective R, G and B sub pixels.

A data voltage applied to each respective driving circuit to set an amplitude of the driving current may be corrected according to a deviation of the respective driving circuit, and wherein each driving circuit from among the plurality of driving circuits comprises a plurality of transistors configured to correct a deviation of pulse width of the driving current caused by the deviation of the respective driving circuit.

Each of the respective driving circuits may include a current source comprising a first transistor connected to the corresponding inorganic light emitting device, the current source being configured to vary a magnitude of the driving current provided to the inorganic light emitting device according to a magnitude of a voltage applied to the first transistor; a pulse amplitude modulation (PAM) driving circuit configured to apply an amplitude setup voltage to the first transistor, the amplitude setup voltage determining an amplitude of the driving current provided to the first transistor; and a pulse width modulation (PWM) driving circuit configured to control a duration of light emission of the corresponding inorganic light emitting device by controlling a voltage of the first transistor based on a pulse width setup voltage determining a pulse width of the driving current.

The voltage applied to the first transistor may be corrected based on a current flowing through the first transistor while a second transistor connected to the first transistor is turned on.

Each of the respective PAM driving circuits may include a third transistor including a source terminal connected to a data line, and a drain terminal connected to a gate terminal of the first transistor; and a first capacitor including a first terminal connected to a source terminal of the first transistor, and a second terminal commonly connected to a gate terminal of the first transistor and a drain terminal of the third transistor, wherein based on the amplitude setup voltage being input through the data line while the third transistor is turned on, the input amplitude setup voltage is charged in the first capacitor, and a voltage charged in the first capacitor is applied to the gate terminal of the first transistor.

The source terminal of the first transistor may be commonly connected to the first terminal of the first capacitor and a driving voltage terminal of the driving circuit, wherein a drain terminal of the first transistor is connected to an anode terminal of the inorganic light emitting device, wherein a cathode terminal of the inorganic light emitting device is connected to a ground voltage terminal of the driving circuit, and wherein while a driving voltage is applied to the driving voltage terminal and the voltage charged in the first capacitor is applied to the gate terminal of the first transistor, and while a voltage of the ground voltage terminal is a ground voltage, a driving current of an amplitude corresponding to a magnitude of the voltage charged in the first capacitor is provided to the inorganic light emitting device.

Each of the PWM driving circuits may include a fourth transistor and a fifth transistor connected to a gate terminal of the fourth transistor and a drain terminal of the fourth transistor; and each of the PWM driving circuits may be further configured to control a duration of light emission of the respective inorganic light emitting device by controlling a gate terminal voltage of the respective first transistor.

The fifth transistor may be configured to be turned on during a threshold voltage setup duration to set a voltage applied to the gate terminal of the fourth transistor to a first voltage based on a threshold voltage of the fourth transistor.

Each of the PWM driving circuits may include a sixth transistor including a source terminal connected to a data line, and a drain terminal commonly connected to the gate terminal of the respective fourth transistor and a source terminal of the respective fifth transistor; a second capacitor including a first terminal commonly connected to the gate terminal of the respective fourth transistor, the source terminal of the respective fifth transistor, and the drain terminal of the respective sixth transistor; a third capacitor including a first terminal receiving a linearly-shifting sweep signal, and a second terminal connected to a second terminal of the second capacitor; and a seventh transistor including a source terminal connected to the data line, and a drain terminal commonly connected to the second terminal of the second capacitor and the second terminal of the third capacitor.

The pulse width setup voltage may be applied by the data line to the source terminal of the seventh transistor, wherein the gate terminal voltage of the fourth transistor reaches, after reaching the first voltage and while the seventh transistor is turned on, a second voltage based on the threshold voltage of the fourth transistor and the pulse width setup voltage, wherein the linearly-shifting sweep signal is applied to the first terminal of the third capacitor, wherein the gate terminal voltage of the fourth transistor is, after reaching the second voltage and based on the linearly-shifting sweep signal being input through the first terminal of the third capacitor, linearly shifted according to the linearly-shifting sweep signal, and wherein the fourth transistor is turned on when the linearly-shifted gate terminal voltage of the fourth transistor reaches the threshold voltage of the fourth transistor.

The sixth transistor may be turned on and off while the fifth transistor is turned on, and the gate terminal voltage of the fourth transistor may become a reference voltage which is input through the data line when the fifth transistor is turned on and the sixth transistor is turned on, and is shifted from the reference voltage to the first voltage when the fifth transistor is turned on and the sixth transistor is turned off.

Each one of the driving circuits disposed in the respective sub pixels may further include an eighth transistor including a drain terminal connected to the first transistor, and a source terminal commonly connected to the drain terminal of the fourth transistor and a drain terminal of the fifth transistor, wherein the eighth transistor is turned on while the sixth transistor is turned on, and applies the reference voltage to the gate terminal of the first transistor.

The display panel may further include a controller configured to, during display of one image frame, sense a current flowing through the first transistor during a sensing duration; after the sensing duration, set the gate terminal voltage of the fourth transistor to a first voltage during a reset duration; after the reset duration, apply the pulse width setup voltage and the amplitude setup voltage to the PWM driving circuit and the PAM driving circuit, respectively, during a data voltage setup duration; and after the data voltage setup duration, drive the inorganic light emitting device to emit a light according to the pulse width setup voltage and the amplitude setup voltage during a light emitting duration.

The controller may be further configured to apply, during the data voltage setup duration, an amplitude setup voltage corrected based on the sensed current flowing through the first transistor during the sensing duration.

The controller may be further configured to sense, during the sensing duration, a current flowing through each of the first transistors included in the plurality of driving circuits for driving inorganic light emitting devices included in a plurality of pixels of at least one horizontal line from among a plurality of lines of the matrix form.

The sensing duration may include a voltage setup duration during which the controller is configured to apply a particular voltage to the first transistor, and a current sensing duration during which the controller is configured to sense the current flowing through the first transistor corresponding to the particular voltage, wherein the current flowing through the first transistor during the sensing duration is sensed for different durations within the sensing duration for each of the R, G, and B sub pixels.

The particular voltage may be applied to the first transistor of each of the R, G and B sub pixels for different durations within the voltage setup duration, and a magnitude of the particular voltage applied to the first transistor may vary based on a type of the respective inorganic light emitting device.

The inorganic light emitting device may include a micro-LED of a size less than or equal to 100 micrometers.

In accordance with an aspect of the disclosure, a method for driving a display panel is provided. The display panel may include a glass; an inorganic light emitting device; and a driving circuit disposed between the glass and the inorganic light emitting device, the driving circuit being configured to provide a driving current to the inorganic light emitting device and to control an amplitude and a pulse width of the driving current, wherein the inorganic light emitting device is mounted on the driving circuit and electrically connected to the driving circuit, and the driving circuit may include a current source comprising a first transistor connected to the inorganic light emitting device, the current source being configured to vary a magnitude of the driving current provided to the inorganic light emitting device according to a magnitude of a voltage applied to the first transistor; a pulse amplitude modulation (PAM) driving circuit configured to apply an amplitude setup voltage to the first transistor, the amplitude setup voltage determining an amplitude of the driving current provided to the first transistor; and a pulse width modulation (PWM) driving circuit configured to control a duration of light emission of the inorganic light emitting device by controlling a voltage of the first transistor based on a pulse width setup voltage determining a pulse width of the driving current. The method may include sensing a current flowing through the first transistor; setting a gate terminal voltage of a second transistor included in the PWM driving circuit to a voltage based on a threshold voltage of the second transistor, the second transistor being configured to control a gate terminal voltage of the first transistor; applying an amplitude setup voltage and the pulse width setup voltage to the PWM driving circuit and the PAM driving circuit, respectively, the amplitude setup voltage and the pulse width setup voltage being corrected based on the sensed current flowing through the first transistor; and illuminating the inorganic light emitting device according to the pulse width setup voltage and the amplitude setup voltage.

According to embodiments of the disclosure, a wavelength shift according to a grayscale or gradation of an inorganic light emitting device included in a display panel can be prevented. In addition, it is possible to correct a stain or color of the inorganic light emitting device included in the display panel. In addition, even in a case that a large-area tiled display panel is configured by combining a display panel in the form of a plurality of modules, a difference of brightness or color among the respective display panel modules can be corrected.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
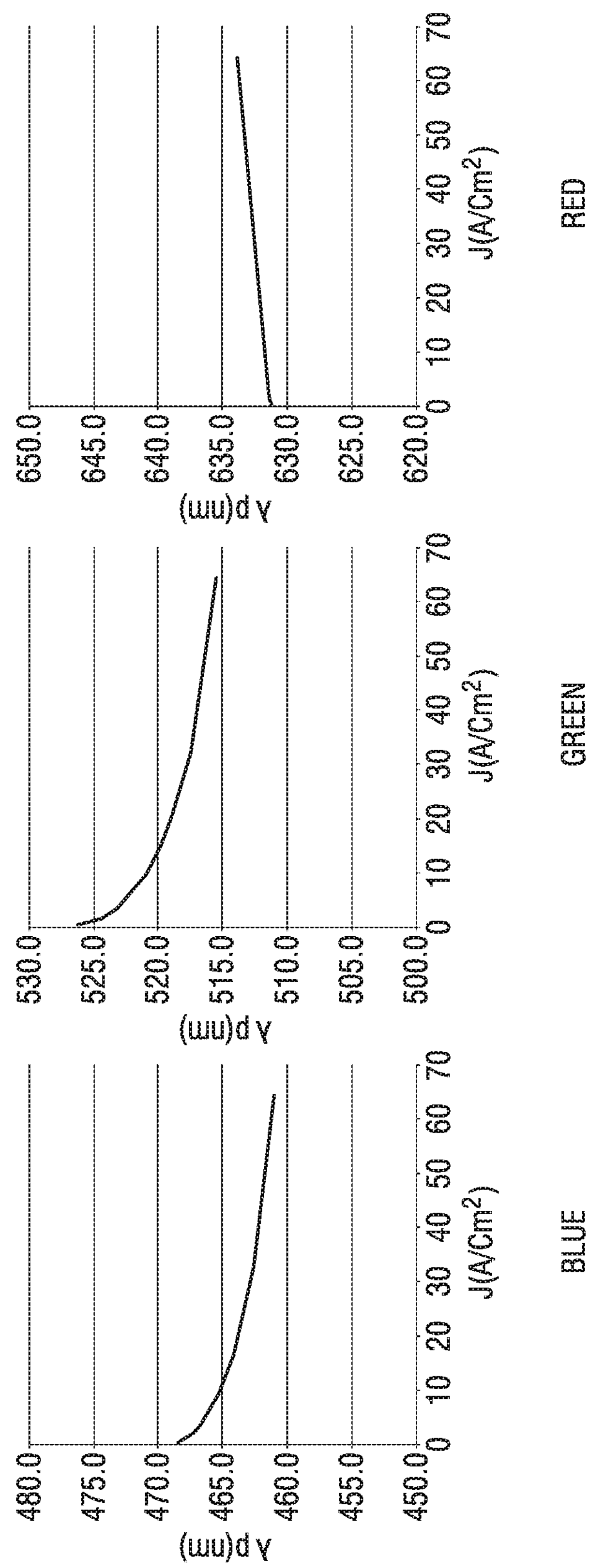
FIG. 1 is a diagram illustrating a wavelength shift according to a magnitude of a driving current flowing through a blue LED, a green LED, and a red LED according to an embodiment.

In the following description, well-known functions or constructions are not described in detail since they would obscure the application with unnecessary detail. In addition, repeated descriptions of the same element are omitted as much as possible.

In the drawings, the same reference numerals are used to represent the same elements.

The term "unit" as it appears in the disclosure does not itself have a distinct meaning or serve a particular purpose beyond the generally understood meaning of the term.

The terms used in the following description are provided to explain embodiments and are not intended to limit the scope. It is to be understood that the singular forms "a," "an," and "the" include plural referents unless the context clearly dictates otherwise.

Throughout this specification, it will be understood that the terms "comprise" and "include" and variations thereof, such as "comprising", "comprises", "including", and "includes", specify the presence of features, numbers, steps, operations, components, parts, or combinations thereof, described in the specification, but do not preclude the presence or addition of one or more other features, numbers, steps, operations, components, parts, or combinations thereof.

In the description, the terms "first, second, and so forth" are used to describe diverse elements regardless of their order and/or importance and to discriminate one element from other elements, but are not limited to the corresponding elements.

If it is described that a certain element (for example, first element) is "operatively or communicatively coupled with/to" or is "connected to" another element (for example, second element), it should be understood that the certain element may be connected to the other element directly or through still another element (for example, third element). To the contrary, it will be understood that when an element (for example, a first element) is "directly coupled with/to" or "directly connected to" another element (for example, a second element), there is no intervening element (for example, a third element) between the element and another element. When it is mentioned that one element (for example, first element) is "directly coupled" with or "directly connected to" another element (for example, second element), it may be understood that there is no element (for example, third element) present between one element and another element.

Unless indicated otherwise, it is to be understood that all the terms used in the disclosure including technical and scientific terms have meanings as understood by those having ordinary skill in the art.

Hereinafter, the present disclosure will be described in detail with reference to the accompanying drawings.

Figure 2A:
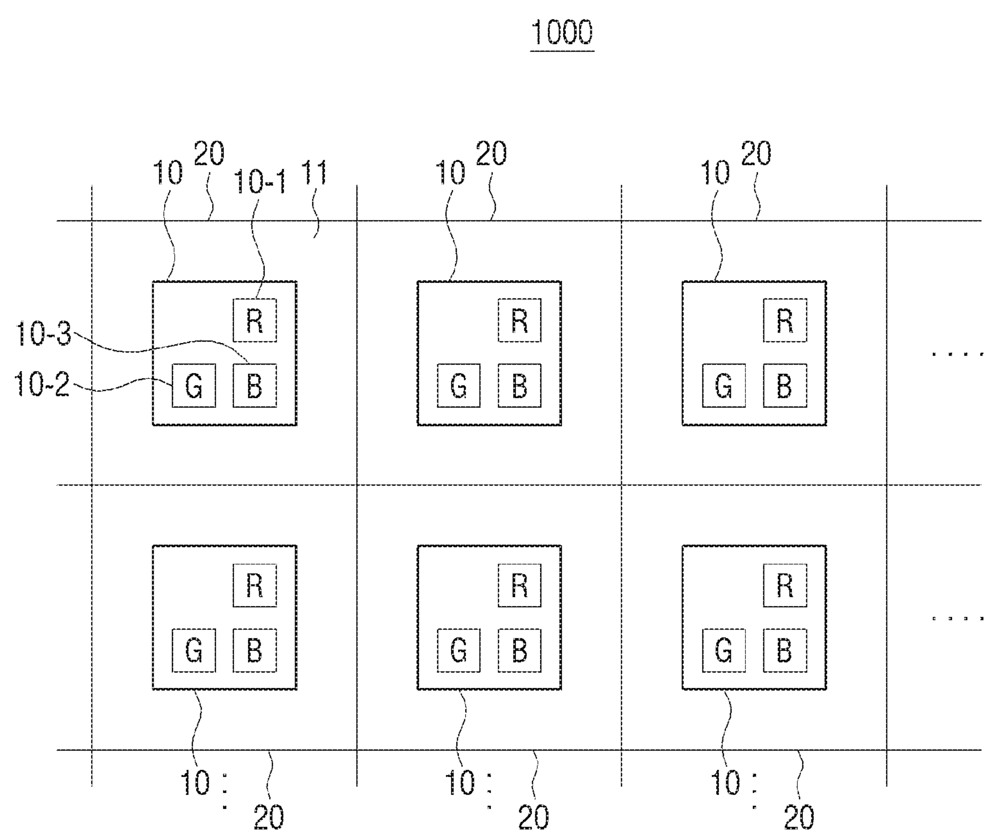
FIG. 2A is a diagram illustrating a pixel structure of a display panel, according to an embodiment.

FIG. 2A is a diagram illustrating a pixel structure of a display panel 1000, according to an embodiment. As illustrated in FIG. 2A, the display panel 1000 may include a plurality of pixels 10 which are arranged in a matrix form.

The respective pixels 10 may include a plurality of sub-pixels 10-1, 10-2 and 10-3. For example, one pixel 10 included in the display panel 1000 may include a sub-pixel of three types: a red (R) sub-pixel 10-1, a green (G) sub-pixel 10-2, and a blue (B) sub-pixel 10-3. That is, one set of R, G and B sub-pixels may constitute a unit pixel of the display panel 1000.

Referring to FIG. 2A, it may be understood that one pixel area 20 of the display panel 1000 may include an area 10 occupied by pixels, and a remaining peripheral area 11.

The area 10 occupied by pixels 10 may include the R, G and B sub-pixels 10-1 to 10-3. The R sub-pixel 10-1 may include an R light emitting device and a driving circuit for driving the R light emitting device. The G sub-pixel 10-2 may include a G light emitting device and a driving circuit for driving the G light emitting device. The B sub-pixel 10-3 may include a B light emitting device and a driving circuit for driving the B light emitting device. Referring to FIG. 2A, it may be understood that the sub-pixels 10-1 to 10-3 in the one pixel 10 are arranged in an L shape. The left and right sides of the L shape may be reversed.

The remaining area 11 peripheral to the pixel 10 may, as will be described with reference to FIGS. 5 and 6, include various circuits for driving the driving circuit according to an embodiment.

Figure 2B:
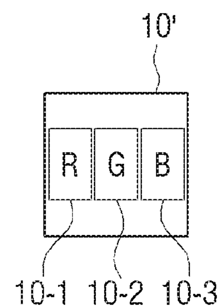
FIG. 2B is a diagram illustrating a sub-pixel structure, according to an embodiment.

FIG. 2B is a diagram illustrating a sub-pixel structure, according to another embodiment. As illustrated in FIG. 2B, the R, G and B sub-pixels 10-1 to 10-3 may be arranged in a row inside a pixel. However, the disposition form of the sub-pixels is only an example, and a plurality of sub-pixels may be disposed in various forms inside the respective pixels.

In the example described above, a pixel includes three types of sub-pixels, but is not limited thereto. For example, a pixel may be implemented of four types such as R, G, B and white (W), and according to an embodiment, a different number of pixels may be included in one pixel. Hereinafter, an example in which the pixel 10 includes a sub-pixel of three types such as R, G and B will be described for convenience of explanation.

Figure 3:
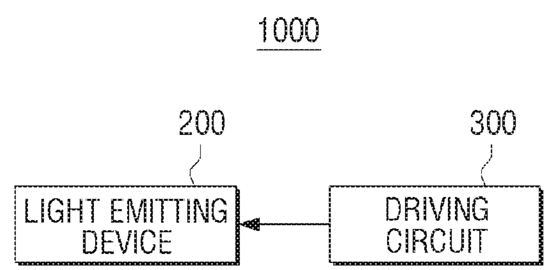
FIG. 3 is a block diagram illustrating a configuration of a display panel, according to an embodiment.

FIG. 3 is a block diagram illustrating a configuration of a display panel, according to an embodiment. Referring to FIG. 3, the display panel 1000 may include a driving circuit 300 and a light emitting device 200. As will be described later, the display panel 1000 may include a driving circuit 300 formed on the glass 100, and a light emitting device 200 formed on the driving circuit 300.

The light emitting device 200 may be included in the sub-pixels 10-1 to 10-3 of the display panel 1000, and may emit light according to driving of the driving circuit 300. The light emitting device 200 may be of a plurality of types according to a color of light emitted. For example, a red (R) light emitting device emitting light in red color, a green (G) light emitting device emitting light in green light, and a blue (B) light emitting device emitting light in blue color may be included.

A type of sub-pixel may be determined according to a type of the light emitting device 200 included in the sub-pixel. That is, the R light emitting device may be included in the R sub-pixel 10-1. The G light emitting device may be included in the G sub-pixel 10-2. The B light emitting device may be included in the B sub-pixel 10-3.

The light emitting device 200 may be an inorganic light emitting device (or an inorganic light emitting diode) by means of an inorganic material which is different from an organic light emitting device (or an organic light emitting diode, OLED) fabricated using an organic material. Hereinafter, the LED refers to an inorganic light emitting device which is distinguished from the OLED.

According to an embodiment, the inorganic light emitting device may be a micro light emitting diode (micro-LED). The micro LED refers to a subminiature inorganic light emitting device of a size less than or equal to 100 micrometers (μm) self-illuminating without a backlight or a color filter.

The driving circuit 300 may drive the light emitting device 200. For example, the driving circuit 300 may drive the light emitting device 200 and express a gray scale or gradation of the sub-pixel. As described above, each one of the sub-pixels may include a light emitting device, and thus, unlike a liquid crystal display (LCD) panel using a plurality of LEDs emitting light in a single color as a backlight, the driving circuit 300 may drive the light emitting device 200 and differently express a grayscale or gradation for each sub-pixel.

To this end, the respective sub-pixels included in the display panel 1000 may be implemented as the light emitting device 200 and a driving circuit 300 for driving the light emitting device 200. That is, the driving circuit 300 for driving the respective device 200 may be present for each sub-pixel.

According to an embodiment, the driving circuit 300 may use pulse amplitude modulation (PAM) drive or pulse width modulation to drive the light emitting device 200. That is, the driving circuit 300 may control an amplitude and pulse width of a driving current driving the light emitting device 200 together, and provide, to the light emitting device 200, the driving current of which the amplitude and pulse width are controlled together.

The amplitude and pulse width of the driving current being controlled "together" does not mean that the amplitude and pulse width of the driving current are controlled simultaneously in time, but means that the PAM drive method and the PWM drive method are employed together to express a grayscale or gradation.

The PWM drive method is a method of expressing a grayscale or gradation according to a duration of light emission of the light emitting device 200. Accordingly, in a case that the light emitting device 200 is driven using the PWM method, even if the driving current has the same amplitude, it is possible to express various grayscales or gradations by adjusting the pulse width of the driving current and controlling the duration of light emission of the light emitting device 200. Accordingly, it is possible to resolve the problem that occurs in a case in which an LED is driven using the PAM method alone, namely, that a wavelength shift of light emitted by an LED (in particular, micro-LED) may occur as a grayscale or gradation is adjusted.

To this end, the driving circuit 300 may include a current source, a PAM driving circuit and a PWM driving circuit for each sub pixel, which will be described in greater detail below.

Figure 4:
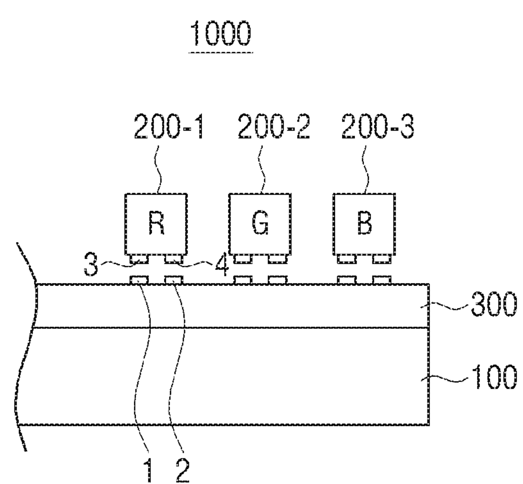
FIG. 4 is a cross-sectional view of a display panel, according to an embodiment.

FIG. 4 is a cross-sectional view of a display panel 100, according to an embodiment. With reference to FIG. 4, only one pixel included in the display panel 1000 is described for convenience of explanation.

Referring to FIG. 4, the driving circuit 300 may be disposed (or arranged) on a glass 100, and the respective light emitting devices R, G and B 200-1 to 200-3 may be arranged (or mounted) on the driving circuit 300 and included in the respective sub pixels 10-1 to 10-3.

As described above, the display panel 1000 in which the driving circuit 300 and the light emitting devices 200-1 to 200-3 are disposed on the glass 100 may be referred to as a display panel of a chip on glass (COG) type. The display panel of the COG type is different from a display panel of a chip on board (COB) type in which a driving circuit and a light emitting device layer are disposed on a substrate such as a synthetic resin and the like.

The driving circuit 300 may be implemented as a thin film transistor (TFT) and included in a TFT layer. In this case, the TFT may be a low temperature poly silicon (LTPS) TFT, but is not limited thereto. The TFT layer 300 disposed on the glass 100 and the glass 100 may be added together and referred to as a TFT panel or a glass substrate. A type or characteristic of the glass 100 included in the glass substrate is not related to the embodiments so that an explanation thereof is omitted.

Although not distinguishably illustrated in the drawings expressly, the driving circuit 300 for driving the respective light emitting devices 200-1 to 200-3 may be present on the driving circuit layer 300 for each of the light emitting devices 200-1 to 200-3. Accordingly, the light emitting devices R, G and B 200-1 to 200-3 may be arranged on the driving circuit 300 so that they are respectively electrically connected to the corresponding driving circuit 300.

As illustrated in FIG. 4, the R light emitting device 200-1 may be mounted or arranged so that an anode electrode 3 and cathode electrode 4 of the R light emitting device 200-1 are respectively connected to an anode electrode 1 and cathode electrode 2 disposed on the driving circuit 300 for driving the R light emitting device 200-1, and the same applies to the G light emitting device 200-2 and the B light emitting device 200-3. According to an embodiment, any one of the anode electrode 1 and the cathode electrode 2 may be implemented as a common electrode.

With reference to FIG. 4, an example in which the light emitting device 200-1 to 200-3 is a micro-LED of a flip chip type is described. However, the example is not limited thereto, and according to an embodiment, the light emitting device 200-1 to 200-3 may be a micro-LED of a lateral type or a micro-LED of a vertical type.

According to an embodiment, the display panel 1000 may further include a multiplexer (MUX) circuit for selecting any one of the plurality of sub pixels 10-1 to 10-3 included in the pixel 10, an electro static discharge (ESD) circuit for preventing a static electricity occurring on the display panel 1000, a power circuit for supplying power to the driving circuit 300, a clock provision circuit for providing a clock driving the driving circuit 300, at least one gate driver for driving pixels of the display panel 1000 arranged in a matrix form by the horizontal line (or by the row), a data driver (or a source driver) for providing a data voltage (for example, amplitude setup voltage) or a pulse width setup voltage to the respective pixels or to the respective sub-pixels, and so on.

An example display panel further comprising these various circuits will be described in greater detail below with reference to FIGS. 5 and 6. In FIGS. 5 and 6, the same elements described above will not be described in detail.

Figure 5:
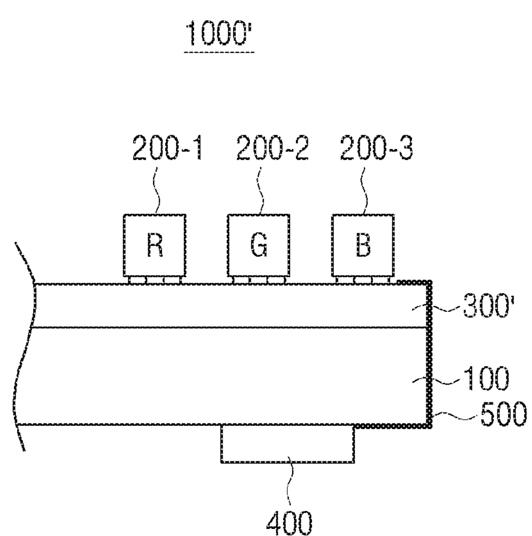
FIG. 5 is a cross-sectional view of a display panel, according to an embodiment.

FIG. 5 is a cross-sectional view of a display panel 1000', according to an embodiment. As illustrated in FIG. 5, the display panel 1000' may include a TFT layer 300' including a driving circuit 300 disposed on the glass 100, a light emitting device 200-1 to 200-3 disposed on the driving circuit 300 and included in a sub pixel of the display panel 1000', various circuits 400 for driving the driving circuit 300, and a connection cable 500 electrically connecting the TFT layer 300' with the various circuits 400.

The TFT layer 300' may include a driving circuit 300 realized as a TFT, and may be formed on a first surface of the glass 100.

The various circuits 400 may include a MUX circuit for operation of the driving circuit 300, an electro static discharge (ESD) circuit, a power circuit, a clock provision circuit, a gate driver, a data driver, and etc., and may be disposed or arranged on a second surface of the glass 100.

According to an embodiment, the connection cable 500 of the display panel 1000' may be disposed in an edge area of a TFT substrate, and the TFT layer 300' disposed on a first surface of the glass 100 and the various circuits 400 disposed on a second surface of the glass 100 may be electrically connected via the connection cable 500.

The connection cable 500 is disposed in the edge area of the TFT substrate because otherwise, a crack may occur on the glass due to a difference of temperature between a fabrication process of a TFT substrate and a process of filling a hole with conductive materials, where a hole penetrating the glass 100 is disposed and circuits arranged on the opposite sides of the glass 100 are connected to each other, In the example described above, all circuits for operation of the driving circuit 300 are, as in the reference numeral 400, separately disposed on the opposite side of the glass 100 surface on which the TFT layer 300' is disposed. However, the example is not limited thereto. That is, all or some of the various circuits may be disposed on the TFT layer 300'.

For example, all the various circuits described above may be disposed on the TFT layer 300', in which case, it is not necessary that a circuit is additionally arranged on the other surface of the glass 100 and accordingly, the connection cable 500 of FIG. 5 connecting front and rear surfaces of the glass 100 would not be necessary, either.

As another example, the MUX circuit, the ESD circuit, the power circuit, the clock provision circuit, and the gate driver may be implemented as a TFT and included in the TFT layer 300', and the display panel may be implemented in such a way that the data driver circuit is additionally arranged on the other side of the glass 100. FIG. 6 is a diagram provided to explain such an embodiment.

Figure 6:
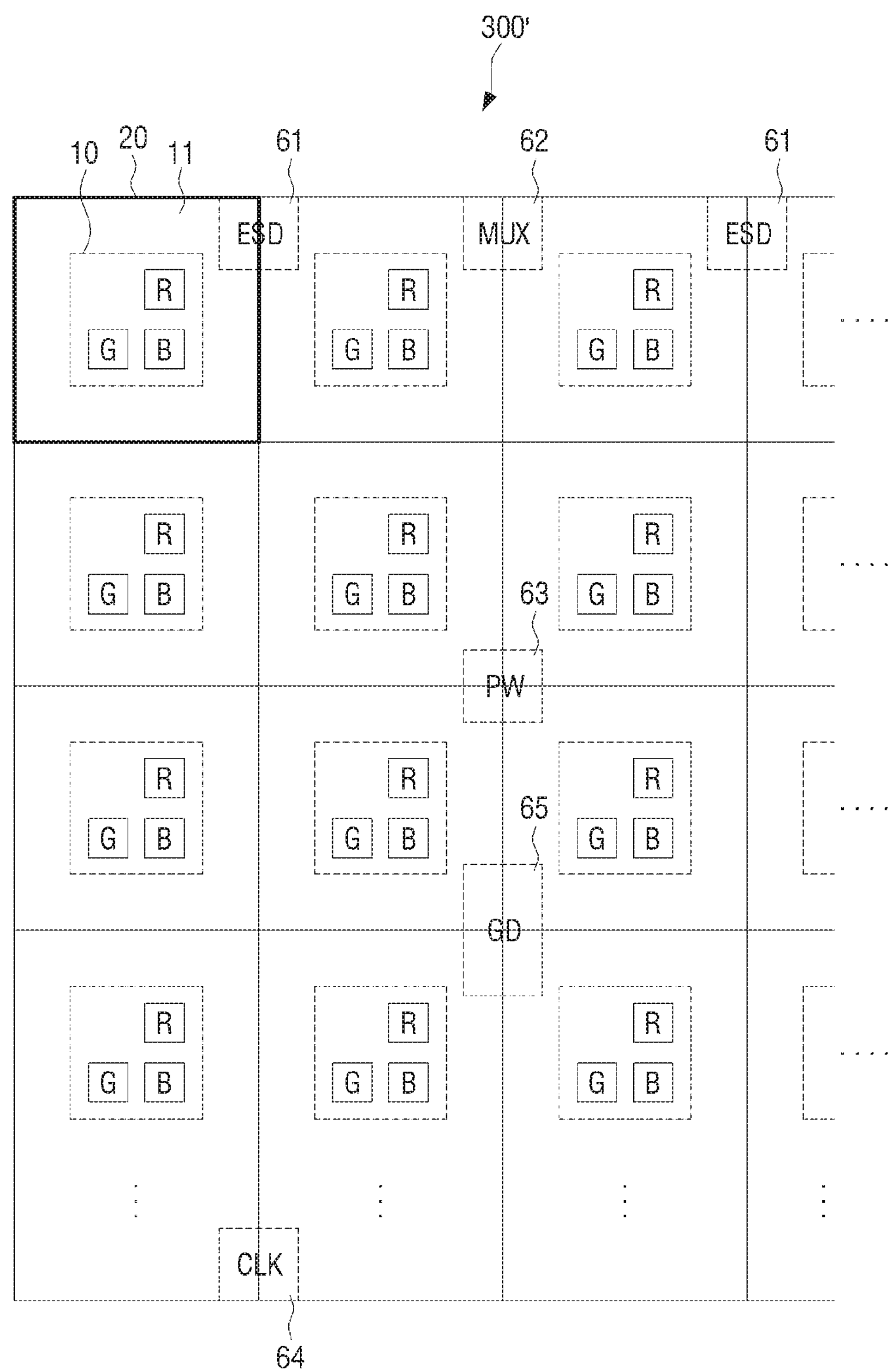
FIG. 6 is a plane view illustrating a thin film transistor (TFT) layer, according to an embodiment.

FIG. 6 is a cross-sectional view of a TFT layer 300', according to an embodiment. In detail, FIG. 6 illustrates a disposition of various circuits included in the TFT layer 300' of the display panel 1000'. Referring to FIG. 6, an entire pixel area 20 occupied by one pixel in the TFT layer 300' may include an area 10 in which various driving circuits 300 for driving the respective R, G and B sub pixels are arranged, and a peripheral remaining area 11. According to an embodiment, a size of the area 10 occupied by a driving circuit for the respective R, G and B sub pixels may be, for example, a size of about a quarter of the entire pixel area 20, but is not limited thereto.

As described above, one pixel area 20 may include the remaining area 11, and so may the other pixels. That is, according to an embodiment, many spaces other than an area occupied by the driving circuit 300 are present in the TFT layer 300', and thus, the ESD circuit 61, the MUX circuit 62, the power circuit 63, the clock provision circuit 64, and the gate driver circuit 65 may be implemented as a TFT and included in the remaining area 11 of the TFT layer 300' as illustrated in FIG. 6. In this case, the data driver circuit may be arranged on the other surface of the glass 100 as in the reference numeral 400 of FIG. 5.

The location, size and number of the respective ESD circuit 61, the MUX circuit 62, the power circuit 63, the clock provision circuit 64, and the gate driver circuit 65 is only an non-limiting example.

In addition, an embodiment in which various circuits are arranged on both sides as being divided based on the glass 100 is not limited to the example of FIG. 6, and at least one circuit from among the ESD circuit 61, MUX circuit 62, power circuit 63, clock provision circuit 64, and gate driver circuit 65 of FIG. 6 may be arranged on the other surface of the glass 100 as in the reference numeral 400.

A constitution and operation of the driving circuit 300 according to various embodiments will not be described in detail with reference to FIGS. 7-11.

Figure 7:
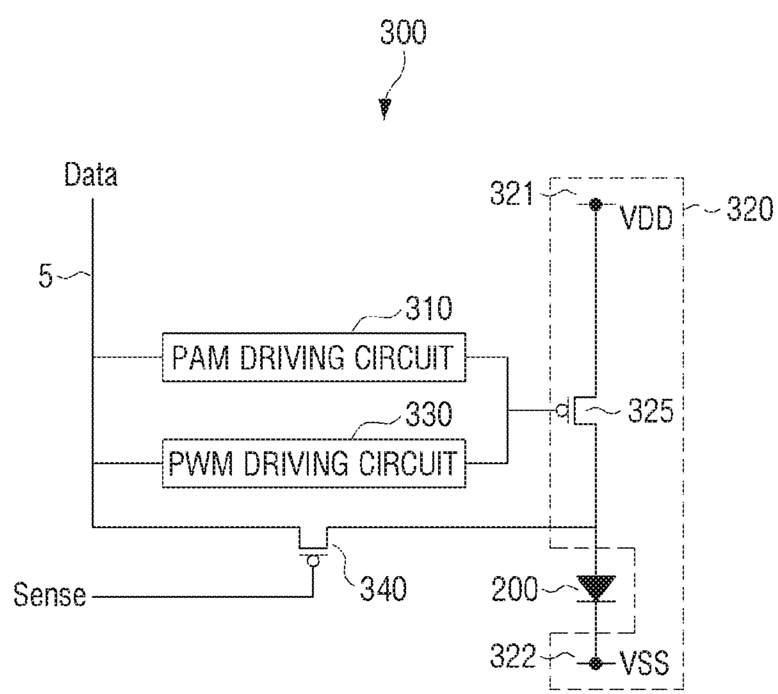
FIG. 7 is a block diagram of a driving circuit included in a display panel, according to an embodiment.

FIG. 7 is a block diagram of a driving circuit 300 included in a display panel 1000 and/or 1000', according to an embodiment. Referring to FIG. 7, the display panel 1000 and/or 1000' may include a light emitting device 200 and a driving circuit 300. In this case, the driving circuit 300 may include a PAM driving circuit 310, a current source 320, and a PWM driving circuit 330.

As described above, the driving circuit 300 may be provided for each sub pixel, and one driving circuit 300 drives one sub pixel and thus may be referred to as a pixel circuit depending on circumstances. In this case, the PAM driving circuit 310 may be referred to as a PAM pixel circuit, and the PWM driving circuit 330 may be referred to as a PWM pixel circuit. For convenience of explanation, the terms "driving circuit" "PWM driving circuit" and "PWM driving circuit 330" are used to describe an embodiment.

FIG. 7 illustrates one sub pixel-related circuit, that is, one light emitting device 200, and a driving circuit 300 for driving the light emitting device 200. Accordingly, the light emitting device 200 and driving circuit 300 as illustrated in FIG. 7 may be provided in the display panel 1000 and/or 1000' by the sub pixel. The light emitting device 200 may be a micro-LED in any one color from among R, G and B.

The light emitting device 200 may emit light according to a driving current provided by the current source 320. For example, the light emitting device 200 may emit light with different brightness according to an amplitude or pulse width of the driving current provided from the current source 320. Here, the pulse width of the driving current may be expressed as a duty ratio of the driving current or a driving time of the driving current.

For example, the light emitting device 200 may emit light of a higher brightness with the increase in the amplitude of the driving current and with the increase in the pulse width (that is, with the increase in the duty ratio or with the increase in the driving time). However, the example is not limited thereto.

The current source 320 may provide a driving current to the light emitting device 200. In this case, the current source 320 may include a first transistor 325 connected to the light emitting device 200, and may provide a driving current of different amplitudes to the light emitting device 200 according to an amplitude of voltage applied to a gate terminal of the first transistor 325.

The current source 320 may provide a driving current 200 of an amplitude corresponding to the amplitude of voltage applied to the gate terminal of the first transistor 325 to the light emitting device 200 via the PAM driving circuit 310. In this case, the voltage of the gate terminal of the first transistor 325 may be controlled via the PWM driving circuit 330 and a pulse width of the driving current may be controlled.

The PWM driving circuit 330 may control the pulse width of the driving circuit provided to the light emitting device 200. For example, the PWM driving circuit 330 may control a voltage applied to the gate terminal of the first transistor 325 according to a pulse width data applied through a data line 5, and control a duration of the driving current, that is, a duration of light emission of the light emitting device 200. Here, the pulse width data may be a pulse width setup voltage determining a pulse width of the driving current, but is not limited thereto.

The PWM driving circuit 330 may include two transistors connected to each other using a so-called "diode connected method". For example, the PWM driving circuit 330 may include a fourth transistor (331 of FIG. 8), and a fifth transistor (332 of FIG. 8) connected to a gate terminal and drain terminal of the fourth transistor (331 of FIG. 8).

Accordingly, in the operation process of the PWM driving circuit 330, a voltage in which a threshold voltage of the fourth transistor 331 is taken into consideration may be applied to the gate terminal of the fourth transistor 331.

According to an embodiment, a deviation of pulse width of the driving circuit 300 occurring due to a deviation among the driving circuits 300 included in the respective sub pixels of the display panel 1000 and/or 1000' (in other words, a deviation of threshold voltage among fourth transistors included in the respective driving circuit 300) can be compensated.

As described above, a method of compensating a threshold voltage of a fourth transistor 331 through a connection structure of the fourth transistor 331 and a fifth transistor 332 in the PWM driving circuit 330 may be referred to as "internal compensation" or "Vth internal compensation".

The PAM driving circuit 310 may control an amplitude of the driving circuit provided to the light emitting device 200. The PWM driving circuit 310 may apply amplitude data received through the data line 5 to a gate terminal of the first transistor 325, and control the amplitude of the driving current. The amplitude data may be a particular voltage or an amplitude setup voltage which will be described later, but is not limited thereto.

According to an embodiment, an amplitude setup voltage corrected based on a current flowing through the light emitting device 200 may be applied to the PWM driving circuit 310.

To sense a current flowing through the light emitting device 200, the driving circuit 300 may include a second transistor 340. The second transistor 340 may transfer a current flowing through the first transistor 325 to the data line 5.

In detail, the second transistor 340 may be connected to in between the first transistor 325 and the data line 5, and may be turned on according to a control signal (Sense) and transfer a current flowing through the first transistor 325 to the data line 5. The current flowing through the data line 5 may be sensed by a current sensor outside of the driving circuit 300.

According to an embodiment, a processor outside of the driving circuit 300 or a timing controller (TCON) may correct an amplitude setup voltage based on the current sensed as above, and apply the corrected amplitude setup voltage to the PAM driving circuit 310.

Accordingly, a deviation of amplitude of the driving circuit 300 occurring due to a deviation among the driving circuits 300 included in the respective sub pixels of the display panel 1000 and/or 1000' (in other words, a deviation of threshold voltage among first transistors included in the respective driving circuit 300) can be compensated.

As described above, a method of compensating a threshold voltage of the first transistor 325 by sensing a current flowing through the first transistor 325 and correcting an amplitude setup voltage may be referred to "external compensation" or "Vth external compensation". As described above, in the driving circuit 300 according to an embodiment, it is possible to control a light emitting device included in a display panel not only by a PAM method but also by a PWM method. Accordingly, a grayscale or gradation may be expressed by a driving current of the same amplitude, and thereby a wavelength shift of a light emitting device according to an amplitude of the driving current can be resolved.

In addition, a deviation of threshold voltage among the first transistors 325 included in each of a plurality of driving circuits included in the display panel 1000 and/or 1000' and a deviation of threshold voltage among the fourth transistors 331 included in each of the plurality of driving circuits included in the display panel 1000 and/or 1000' may be compensated, and thereby it is possible to correct a stain of the display panel and a color deviation among light emitting devices occurring due to the deviation of threshold voltage among the first transistors and the deviation of threshold voltage among the fourth transistors.

In addition, according to an embodiment, even in a case that the display panel 1000 and/or 1000' is one module included in a tiled display panel for which a plurality of modules are combined with one another, a difference of brightness of color among the respective modules may be corrected.

Figure 8:
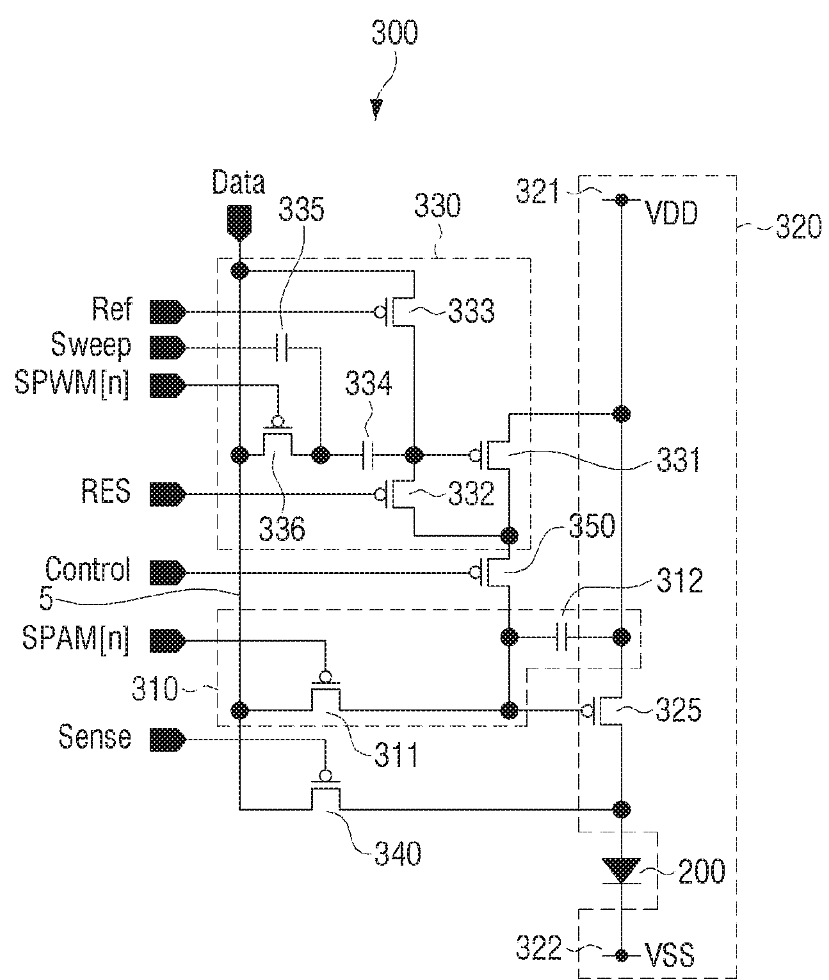
FIG. 8 is a detailed circuit diagram of a driving circuit illustrated in FIG. 7 according to an embodiment.
Figure 9:
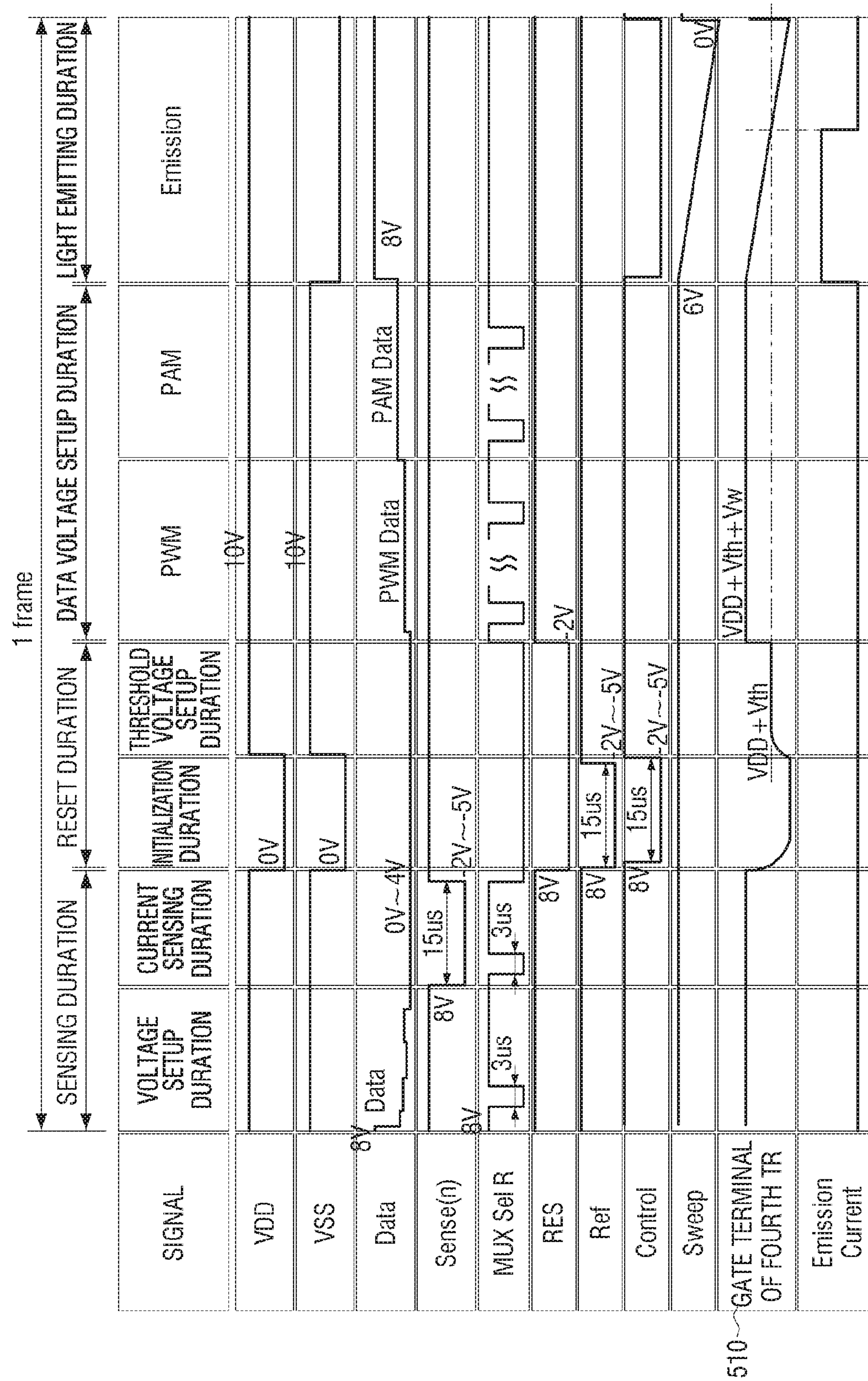
FIG. 9 is a timing diagram of various signals for driving a driving circuit, according to an embodiment.
Figure 10:
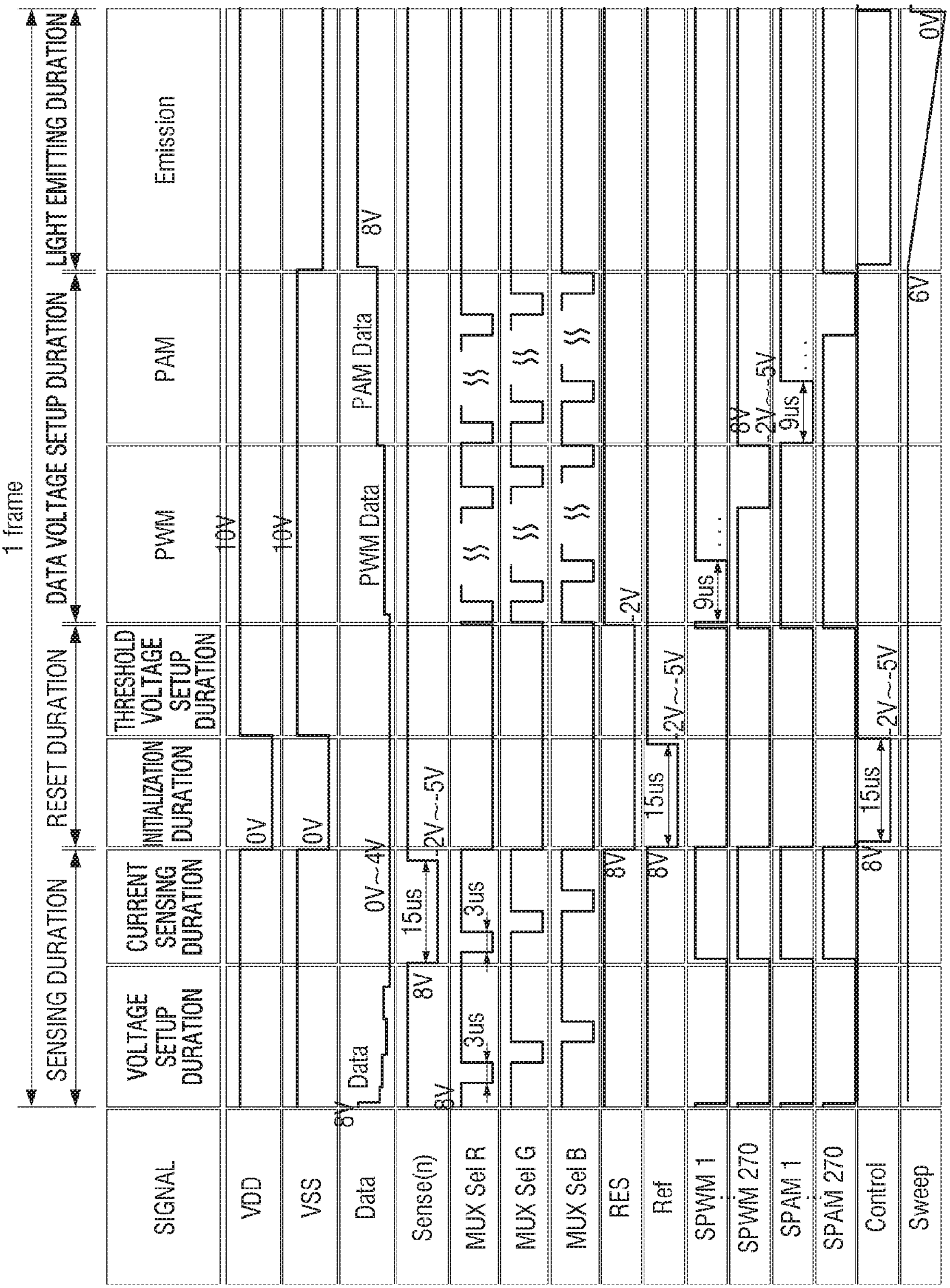
FIG. 10 is a timing diagram of various signals for driving an entire plurality of driving circuits included in a display panel according to an embodiment.

The following will explain the details and operation of the driving circuit 300 in detail by referring to FIGS. 8 to 10. FIG. 8 illustrates a detailed circuit diagram illustrating the driving circuit 300 illustrated in FIG. 7. In an embodiment, the driving circuit 300 includes a first transistor 325, a second transistor 340, a third transistor 311, a fourth transistor 331, a fifth transistor 332, a sixth transistor 333, a seventh transistor 336, and an eighth transistor 350. In an embodiment, the driving circuit 300 includes a first capacitor 312, a second capacitor 334, and a third capacitor 335.

Referring to FIG. 8, the display panel 1000 and/or 1000' may include a light emitting device 200 and a driving circuit 300. In this case, the driving circuit 300 may include a PAM driving circuit 310, a current source 320, a PWM driving circuit 330, a second transistor 340, and an eighth transistor 350.

The PAM driving circuit 310 may apply a voltage input through the data line 5 to a gate terminal of the first transistor 325.

To this end, the PAM driving circuit 310 may include a third transistor 311 of which a source terminal is connected to the data line 5 and a drain terminal is connected to a gate terminal of the first transistor 325, and a first capacitor 312 of which one terminal is connected to a source terminal of the first transistor 325 and the other terminal is commonly connected to the gate terminal of the first transistor 325 and a drain terminal of the third transistor 311.

The PAM driving circuit 310 may, when an amplitude setup voltage (PAM data) is input through the data line 5 while the third transistor 311 is turned on according to a control signal (SPAM(n)), charge the input amplitude setup voltage in the first capacitor 312, and apply the voltage charged in the first capacitor 312 to the gate terminal of the first transistor 325.

As illustrated in FIG. 8, the source terminal of the first transistor 325 may be commonly connected to one terminal of the first capacitor 312 and a driving voltage terminal 321 of the driving circuit 300. The drain terminal of the first transistor 325 may be connected to an anode terminal of the light emitting device 200, and the drain terminal of the light emitting device 200 may be connected to a ground voltage terminal 322 of the driving circuit 300.

The current source 320 may, in a state that a driving voltage (VDD) is applied to the driving voltage terminal 321 and the voltage charged in the first capacitor 312 is applied to the gate terminal of the first transistor 325, when a voltage of the ground voltage terminal 322 becomes a ground voltage (VSS), provide, to the light emitting device 200, a driving current of an amplitude corresponding to an amplitude of the voltage charged in the first capacitor 312.

As illustrated in FIG. 8, for the eighth transistor 350, the drain terminal may be connected to the gate terminal of the first transistor 325, the source terminal may be commonly connected to a drain terminal of the fourth transistor 331 and a drain terminal of the fifth transistor 332, and the PAM driving circuit 310 and the PWM driving circuit 330 may be electrically connected to or separated from each other according to a control signal (Control) using the eighth transistor 350.

The PWM driving circuit 330 may, when a pulse width setup voltage determining a pulse width of a driving current is applied through the data line 5, control a voltage of the gate terminal of the first transistor 325 on the basis of the pulse width setup voltage.

To this end, the PWM driving circuit 330 may include a fourth transistor 331, a fifth transistor 332 connected to a gate terminal and drain terminal of the fourth transistor 331, a sixth transistor 333 having a drain terminal that is commonly connected to the gate terminal of the fourth transistor 331 and a source terminal of the fifth transistor 332, a second capacitor 334 of which one terminal is commonly connected to the gate terminal of the fourth transistor 331, the source terminal of the fifth transistor 332 and the drain terminal of the sixth transistor 333, a third capacitor 335 of which one terminal receives input of a sweep signal and the other terminal is connected to the other terminal of the second capacitor 334, and a seventh transistor 336 of which a source terminal is connected to the data line 5 and a drain terminal is commonly connected to the other terminal of the second capacitor 334 and the other terminal of the third capacitor 335.

In this case, the eighth transistor 350 may be connected to the gate terminal of the first transistor 325 and the drain terminal of the fourth transistor 331.

A gate terminal voltage of the fourth transistor 331 may be a voltage based on a threshold voltage of the fourth transistor 331 while the fifth transistor 332 is turned on. Thereafter, while the seventh transistor 336 is turned on according to a control signal (SPWM(n)), when a pulse width setup voltage (PWM data) is input through the data line 5, the gate terminal voltage of the fourth transistor 331 may be a voltage based on the threshold voltage and pulse width setup voltage of the fourth transistor 331, and thereafter, when a linearly shifting sweep signal is input through one terminal of the third capacitor 335, the gate terminal voltage of the fourth transistor 331 may be linearly shifted according to the sweep signal.

When the linearly-shifted gate terminal voltage of the fourth transistor 331 reaches the threshold voltage of the fourth transistor 331, the fourth transistor 331 may be turned on and a driving voltage (VDD) applied to the source terminal of the fourth transistor 331 may be applied to the gate terminal of the first transistor 325 through the drain terminal of the fourth transistor 331 (in this case, it is necessary that the eighth transistor 350 is also turned on according to the Control signal). Accordingly, the first transistor 325 may be turned off and the driving current flowing through the light emitting device 200 may be stopped, and thereby a light emitting time of the light emitting device 200 can be controlled.

In this case, an inclination of linear shift of the sweep signal may be the same for all driving circuits 300 included in a display panel, and the gate terminal voltage of the fourth transistor 331 may be linearly shifted from a voltage based on the threshold voltage and pulse width setup voltage of the fourth transistor 331 according to an input of the sweep signal.

Accordingly, a time required for the gate terminal voltage of the fourth transistor 331 to reach the threshold voltage of the fourth transistor 331 after the sweep signal is applied differs according to an amplitude of the pulse width setup voltage, and thus the PWM driving circuit 330 may express a variety of grayscales or gradations according to the amplitude of the pulse width setup voltage.

In addition, a driving time of a driving current (that is, a pulse width of a driving current) flowing through the first transistor 325 is a period from when the gate terminal voltage of the fourth transistor 331 is linearly shifted in response to the input sweep signal until it reaches the threshold voltage of the fourth transistor 331, and thus is properly determined regardless of the threshold voltage of the fourth transistor 331.

According to an embodiment, it is possible to compensate a deviation of threshold voltage among the fourth transistors 331 included in each of a plurality of driving circuits included in a plurality of pixels of the display panel 1000 and/or 1000'.

As illustrated in FIG. 8, it may be understood that the display panel 1000 and/or 1000' according to various embodiments is a display panel of an active matrix (AM) drive method where the driving circuit 300 for driving the respective sub pixels is implemented as a TFT.

FIG. 9 is a timing diagram of various signals for driving the driving circuit 300 of FIG. 8, according to an embodiment. FIG. 9 illustrates a case where the driving circuit 300 is included in a red sub pixel (in other words, an R sub pixel is selected through a multiplexer (Mux) from among R, G and B sub pixels). The various voltages and times illustrated in FIG. 9 are only an example, and the example is not limited to the corresponding values.

Referring to FIG. 9, the driving circuit 300 may be, while one image frame is displayed, driven in the order of a sensing duration, a reset duration, a data voltage setup duration, and a light emitting duration.

The sensing duration is a duration for sensing a current flowing through the first transistor 325. The sensing duration may include a voltage setup duration for applying a particular voltage to the gate terminal of the first transistor 325, and a current sensing duration for sensing a current flowing through the first transistor 325 corresponding to the particular voltage.

The particular voltage is a voltage distinct from an amplitude setup voltage determining an amplitude of a driving current provided to the light emitting device 200. The particular voltage is a voltage for sensing the current flowing through the first transistor 325 corresponding to the particular voltage and correcting a deviation of threshold voltage among the first transistors 325 included in each of the plurality of driving circuits 300.

In detail, when the third transistor 311 is turned on according to the control signal (SPAM(n)) within the voltage setup duration, the particular voltage is charged in the first capacitor 312 through the data line 5. Thereafter, when the second transistor 340 is turned on according to the Sense signal within the current sensing duration, a current corresponding to the particular voltage flowing through the first transistor 325 may be transferred to the data line 5 through the second transistor 340.

The particular voltage may be variously set according to embodiments. For example, a particular voltage for sensing a driving voltage (that is, typical current) when the display panel is normally driven and a particular voltage for sensing a driving current (that is, peak current) when the display panel is driven at a maximum brightness may be different from each other, and as necessary, a particular voltage of different amplitudes may be applied through the data line 5 during the voltage setup duration.

As described above, the current flowing through the data line 5 may be sensed by a current sensor outside of the driving circuit 300. Accordingly, according to an embodiment, a processor or timing controller (TCON) outside of the driving circuit 300 may correct an amplitude setup voltage for each of the driving circuits 300 on the basis of a current sensed as described above, and apply the corrected amplitude setup voltage to the PAM driving circuit 310 during the data voltage setup duration, and thereby a deviation of threshold voltage among the first transistors 325 included in each of the plurality of driving circuits 300 included in the display panel can be compensated.

For example, if a particular voltage applied to the gate terminal of the first transistor 325 during the voltage setup duration is a and an amplitude of the sensed current is x, the processor or the timing controller (TCON) may identify an amplitude of current (for example, y) corresponding to the voltage a from a pre-stored table with which a particular voltage and an amplitude of current are mapped.

Accordingly, if the sensed current x is greater than y, that is, if the sensed current is greater than a current according to the pre-stored table, the processor or the timing controller (TCON) may correct an amplitude setup voltage to be applied to the first transistor 325 during the actual data voltage setup duration afterwards to be less than an amplitude setup voltage that would originally have been applied without the correction. If x is less than y, the amplitude setup voltage may be corrected to have an even higher value and applied to the PAM driving circuit 310.

Accordingly, it is possible to compensate the deviation of threshold voltage among the first transistors 325 included in each of the plurality of driving circuits 300 included in the plurality of pixels of the display panel.

The reset duration is a period for setting the gate terminal voltage of the fourth transistor 331 to a voltage based on the threshold voltage of the fourth transistor 331. The reset duration may include an initialization duration for setting the gate terminal voltage of the fourth transistor 331 and/or the gate terminal voltage of the first transistor 325 to a preset reference voltage, and a threshold voltage setup duration for setting the gate terminal voltage of the fourth transistor 331 to a voltage based on the threshold voltage of the fourth transistor 331.

When the reset duration is started, the fifth transistor 332 may be turned on according to a control signal (RES). While the fifth transistor 332 is turned on, the sixth transistor 333 may be turned on or off according to a control signal (Ref). That is, the sixth transistor 333 may be, as illustrated in FIG. 9, turned on and then turned off during an initialization duration.

When the sixth transistor 333 is turned on, a preset reference voltage (in the example of FIG. 9, a predetermined voltage in the range of 0V to 4V) may be applied to the gate terminal of the fourth transistor 331 through the data line 5, and thus the gate terminal voltage of the fourth transistor 331 may be, as illustrated in reference numeral 510 of FIG. 9, set to the reference voltage while the sixth transistor 333 is turned on.

Thereafter, when a threshold voltage setup duration is started, the sixth transistor 333 may be turned off, and accordingly, the gate terminal voltage of the fourth transistor 331 may be set to a voltage corresponding to the sum of the driving voltage (VDD) and the threshold voltage (Vth) of the fourth threshold voltage 331.

Referring to FIG. 9, the eighth transistor 350 is turned on according to the Control signal while the sixth transistor 333 is turned on, and thus a reference voltage applied to the gate terminal of the fourth transistor 331 may be applied the same to the gate terminal of the first transistor 325. That is, during the initialization duration, both the gate terminal voltage of the fourth transistor 331 and the gate terminal voltage of the first transistor 325 may be set to a predetermined reference voltage (for example, 0V).

As described above, the gate terminal voltage of the fourth transistor 331 and the gate terminal voltage of the first transistor 325 may be clearly set to a reference voltage prior to the threshold voltage setup duration, thereby preventing an inaccurate operation due to floating of the gate terminal voltage of the fourth threshold voltage 331.

The data voltage setup duration is a period for respectively applying a pulse width setup voltage (PWM data) and an amplitude setup voltage (PAM data) to the PWM driving circuit 330 and the PAM driving circuit 310.

For example, when the seventh transistor 336 is turned on according to the control signal (SPWM(n)) during the data voltage setup duration, a pulse width setup voltage is applied through the data line 5 to the gate terminal of the fourth transistor 331 through the second capacitor 334.

Accordingly, the gate terminal voltage of the fourth transistor 331 may, as illustrated in reference numeral 510 of FIG. 9, rise by a pulse width setup voltage (Vw), and the increased voltage may be maintained by the second capacitor 334.

When the third transistor 311 is turned on according to the control signal (SPAM(n)) during the data voltage setup duration, an amplitude setup voltage applied through the data line 5 may be charged in the first capacitor 312 and maintained. In this case, the amplitude setup voltage applied through the data line 5 may be a voltage which is corrected based on a current flowing through the first transistor 325 sensed during the sensing duration.

In the example of FIG. 9, a PWM data, that is, a pulse width setup voltage is applied first and then, a PAM data, that is, an amplitude setup voltage, is applied. However, the example is not limited thereto, and according to embodiments, the PWM data may be applied after a PAM data is applied.

The light emitting duration is a period for which the light emitting device 200 emits light according to a pulse width setup voltage and an amplitude setup voltage. As illustrated in FIG. 9, when a light emitting duration is started, a voltage of a ground voltage terminal 322 of the driving circuit 300 may fall to a ground voltage (VSS, for example, 0V), and the first transistor 325 may be accordingly turned on and a driving current of an amplitude corresponding to the amplitude setup voltage charged in the first capacitor 312 may be provided to the light emitting device 200. Accordingly, the light emitting device 200 initiates light emission.

When the light emitting duration is started, a sweep voltage may be applied to one terminal of the second capacitor 334 through the third capacitor 335, and thus the gate terminal voltage of the fourth transistor 331 connected to the other terminal of the second capacitor 334 may be linearly reduced from the maintained voltage (VDD+Vth+Vw) according to the sweep voltage.

When the gate terminal voltage of the fourth transistor 331 being linearly reduced reaches the threshold voltage Vth of the fourth transistor 331, the fourth transistor 331 may be turned on, and a driving voltage VDD may be applied to the gate terminal of the first transistor 325 via the eighth transistor 350. Accordingly, when the first transistor 325 is turned off, the driving current may be blocked and the light emitting device 200 stops emitting light.

That is, the light emitting device 200 may emit light from a time when a light emitting duration is started until the gate terminal voltage of the fourth transistor 331 is linearly reduced according to a sweep voltage and reaches the threshold voltage Vth of the fourth transistor 331.

FIG. 10 is a timing diagram of various signals for driving an entire plurality of driving circuits included in a display panel. In FIG. 10, the same elements described above will not be described in detail. The numerical figures of various voltages and times illustrated in FIG. 10 are only an example, and are not limited to the corresponding values.

As described above, a plurality of pixels respectively including R, G and B sub pixels are arranged in the display panel 1000 and/or 1000'. Accordingly, the display panel 1000 and/or 1000' may include a plurality of light emitting devices and a plurality of driving circuits for driving the plurality of light emitting devices. FIG. 10 illustrates an embodiment of the display panel 1000 and/or 1000' in which the plurality of pixels are configured as 270 horizontal lines.

Accordingly, referring to FIG. 10, it may be understood that in control signals SPWM and SPAM, SPWM 1 to SPWM 270 and SPAM 1 to SPAM 270 are respectively driven in sequence during the data voltage setup duration.

According to an embodiment, the R, G and B sub pixels included in the respective pixels of the display panel 1000 and/or 1000' may have a structure of being connected to a single data line 5. The R, G and B sub pixels may respectively receive different data voltages applied through the data line 5 via a multiplexer (Mux, which includes MUX Sel R, MUX Sel G, and MUX Sel B).

That is, as illustrated in FIG. 10, the R, G and B sub pixels included in the respective pixels of the display panel 1000 and/or 1000' may be time-division driven (or, sequentially selected) through a Mux during the data voltage setup duration, and receive input of a pulse width setup voltage or amplitude setup voltage of different magnitudes from the data line 5.

This operation is applied in the same way during the sensing duration. As illustrated in FIG. 10, the R, G and B sub pixels included in the respective pixels of the display panel 1000 and/or 1000' may be sequentially selected through the Mux during the voltage setup duration and receive input of a particular voltage of different magnitudes from the data line 5.

In this case, a particular voltage input to the respective R, G and B sub pixels may be a value which is theoretically or experimentally determined based on a type of a sub pixel. According to an embodiment, a particular voltage of different magnitudes may be input to the respective R, G and B sub pixels, or a particular voltage of the same magnitude may be input to the respective R, G and B sub pixels.

In addition, the display panel 1000 and/or 1000' may be driven in such a way that a current flowing through the first transistor 325 of the driving circuit 300 corresponding to the R, G and B sub pixels during the sensing duration is sensed in different durations within the current sensing duration.

In this case, according to an embodiment, the display panel 1000 and/or 1000' may be driven to sense a current flowing through first transistors 325 of a plurality of driving circuits included in a plurality of pixels included in one horizontal line (or one row) from among a plurality of pixels configured in a matrix form during the sensing duration.

That is, the display panel 1000 and/or 1000' may be driven to sense only a current flowing through the first transistors 325 of the plurality of driving circuits included in the plurality of pixels arranged on one horizontal line, with respect to one image frame.

That is, the display panel 1000 and/or 1000' may be driven to sense a current flowing through the first transistors 325 only with respect to one horizontal line per image frame.

In this case, the display panel 1000 and/or 1000' may be driven to sequentially shift a horizontal line for each image frame and sense a current flowing through the first transistors 325 included in the corresponding line.

In general, a time for which one image frame is displayed is a very short period of time that a viewer cannot recognize with the naked eye, and thus, even if only one horizontal line of one image frame is sensed as described above, it may be sufficient to compensate a deviation of threshold voltage among the first transistors.

However, the example is not limited thereto, and the display panel 1000 and/or 1000' may be driven to sense a current flowing through the first transistors included in two or more horizontal lines during the sensing duration for one image frame.

In the example described above, all transistors 325, 350, 311, 331, 332, 333, 336 and 340 included in the driving circuit 300 are implemented as a P-channel metal oxide semiconductor field effect transistor (PMOSFET), but are not limited thereto.

Figure 11:
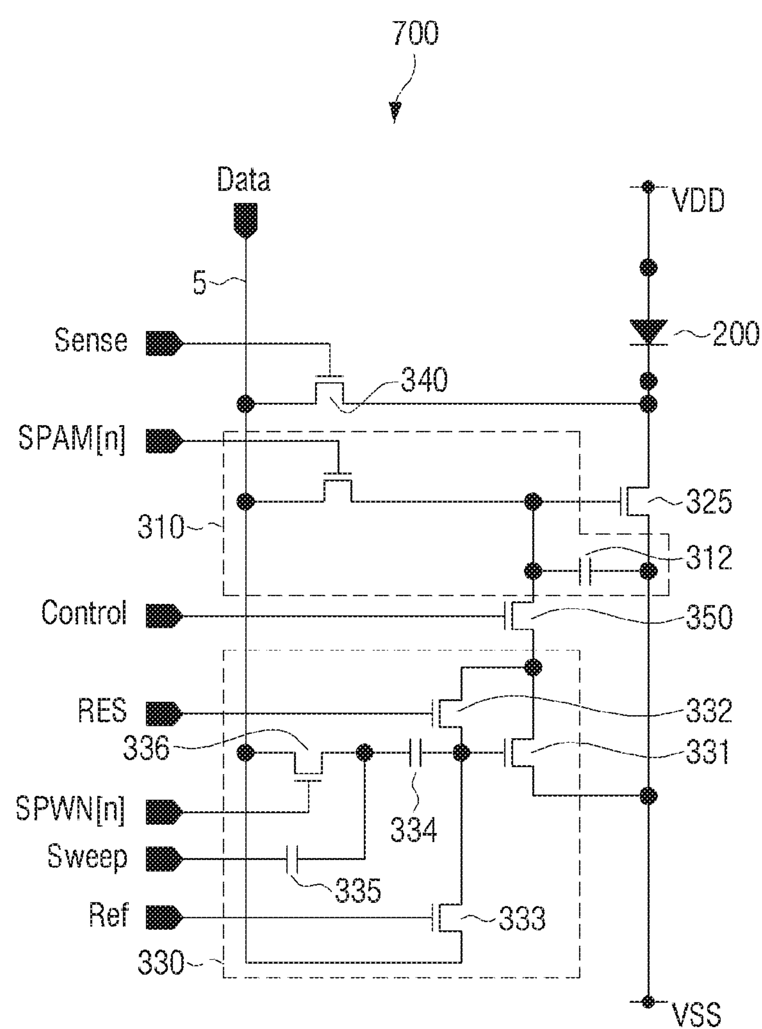
FIG. 11 is a circuit diagram of a driving circuit including transistors respectively implemented as n-type metal-oxide-semiconductor field-effect transistor (nMOSFET) according to an embodiment.

According to an embodiment, a driving circuit of which all transistors are implemented as an N-channel metal oxide semiconductor field effect transistor (NMOSFET) may be implemented to perform the same operation as the driving circuit 300 as described above. FIG. 11 illustrates a driving circuit of which all transistors are implemented as an NMOSFET.

The driving circuit 700 of FIG. 11 may perform the same operation as the driving circuit 300 of FIG. 8 excluding a difference due to a type of transistor (for example, a difference of connection relationship between devices and a difference of polarity of various signals to be applied). Accordingly, in the driving circuit 700 of FIG. 11, the same reference numeral is used for devices performing the same function as the devices included in the driving circuit 300 of FIG. 8. The configuration and operation of the driving circuit 700 would be easily understood by those skilled in the art through the description shown above, and thus the redundant description will be omitted herein.

Figure 12:
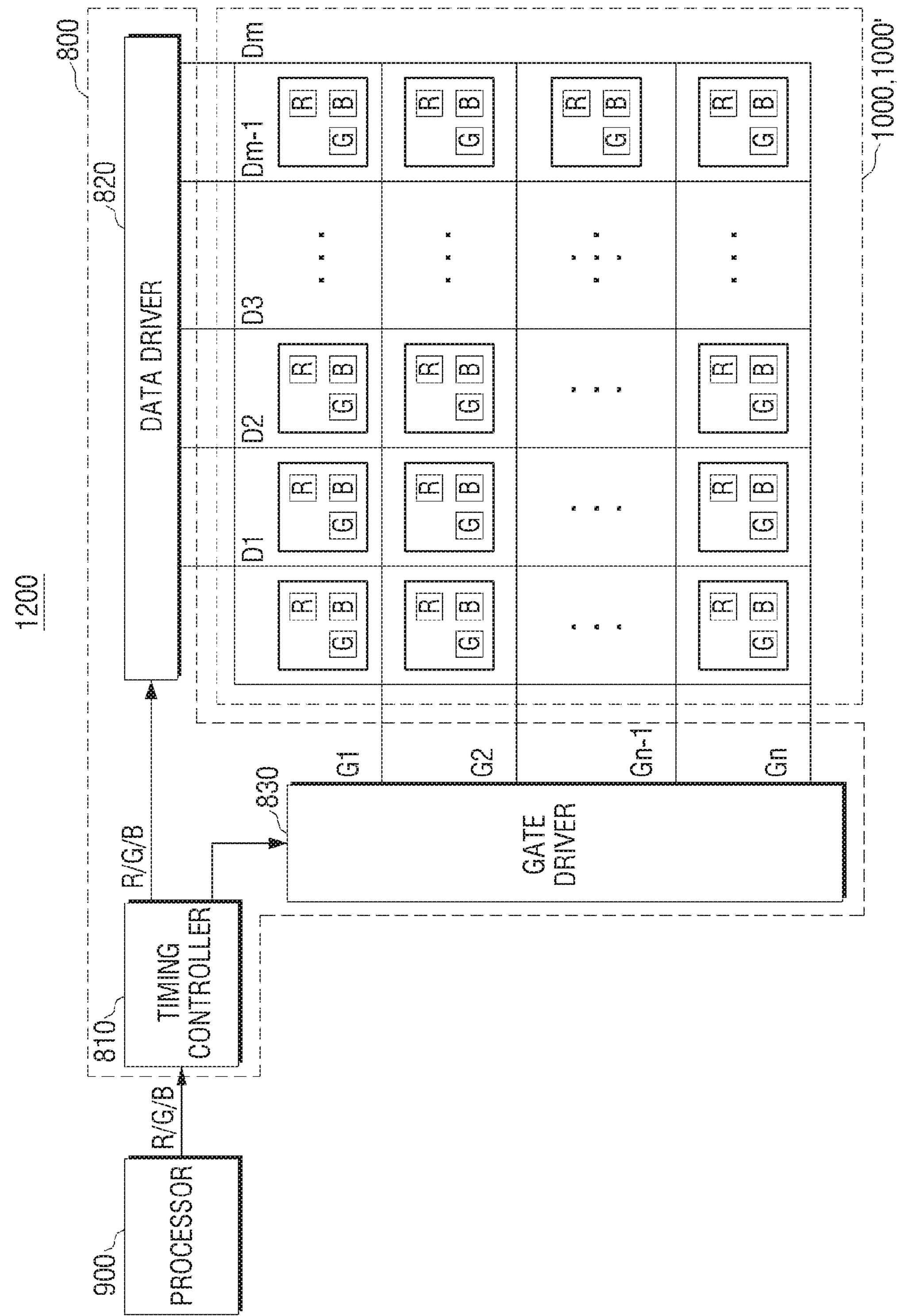
FIG. 12 is a diagram illustrating a configuration of a display apparatus, according to an embodiment.

FIG. 12 is a diagram illustrating a configuration of a display apparatus, according to an embodiment. Referring to FIG. 12, a display apparatus 1200 may include a display panel 1000 and/or 1000', a panel driver 800, and a processor 900.

The display panel 1000 and/or 1000' may include a plurality of light emitting devices 200 included in a plurality of sub pixels, and a plurality of driving circuits 300 and/or 700 for driving the respective light emitting devices 200.

For example, the display panel 1000 and/or 1000' may be disposed such that gate lines G1 to Gn and data lines D1 to Dm intersect with each other, and the driving circuit 300 and/or 700 may be disposed in an area in which the intersection is provided. For example, the plurality of driving circuits 300 may be respectively configured such that adjacent R, G and B sub pixels form one pixel, but the example is not limited thereto.

In FIG. 12, for convenience of illustration, one gate signal line G1 to Gn is illustrated as a line for applying a control signal from the gate driver 830 to the respective driving circuits 300 and/or 700 included in the display panel 1000 and/or 1000'. However, the respective gate signal lines may include a Sense line (Sense 1 to Sense n), a SPWM line (SPWM 1 to SPWM n), and a SPAM line (SPAM 1 to SPAM n).

The panel driver 800 may be controlled by the processor 900 to drive the display panel 1000 and/or 1000' (in more detail, each of the plurality of driving circuits 300), and may include a timing controller 810, a data driver 820, and a gate driver 830.

The timing controller 810 may receive an input signal IS, a horizontal synchronizing signal Hsync, a vertical synchronizing signal Vsync and a main clock signal MCLK from the outside, and generate an image data signal, a scanning control signal, a data control signal, a light emission control signal, and the like to the display panel 1000 and/or 1000' and provide the generated signals to the display panel 1000 and/or 1000', the data driver 820, the gate driver 830, and the like.

For example, the timing controller 810 may, according to various embodiments, apply a control signal (Ref), a control signal (Sweep), a control signal (RES), a control signal (Control), and a control signal (MUX Sel R, G, B) to the driving circuit 300 and/or 700.

The data driver 820 (or source driver) may, as a means for generating a data signal, receive an image data of a R/G/B component from the processor 900 and generate a data signal (for example, a particular voltage, an amplitude setup voltage, and a pulse width setup voltage). In addition, the data driver 820 may apply the generated data signal to the display panel 1000 and/or 1000'.

The gate driver 830 may, as a means for generating various control signals such as a control signal (Sense), a control signal (SPWM), a control signal (SPAM), and the like, transfer the generated various control signals to a particular row (or a particular horizontal line) of the display panel 1000 and/or 1000'.

For example, in the driving circuit 300 and/or 700 to which the control signal (Sense) has been transferred, the second transistor 340 may be turned on and a current flowing through the first transistor 325 may be sensed through the data line 5. In addition, in the driving circuit 300 and/or 700 to which the control signal (SPAM) has been transferred, the third transistor 311 may be turned on and an amplitude setup voltage output from the data driver 820 may be transferred through the data line 5. In addition, in the driving circuit 300 and/or 700 to which the control signal (SPAM) has been transferred, the seventh transistor 336 may be turned on and a pulse width setup voltage output from the data driver 820 may be transferred through the data line 5.

In addition, the gate driver 830 may apply a driving voltage (VDD) to the driving voltage terminal 321 of the driving circuit 300 and/or 700 according to an embodiment.

Some or all of the data driver 820 and the gate driver 830 may, as described above, be included in a TFT layer 300' disposed on one surface of the glass 100 of the display panel 1000 and/or 1000' or implemented as an additional semiconductor integrated circuit (IC) and arranged on the other surface of the glass 100.

The processor 900 may include various processing circuitry and controls overall operations of the display apparatus 1200. In particular, the processor 900 may control the panel driver 800 to drive the display panel 1000 and/or 1000' so that the driving circuit 300 and/or 700 performs the operations described above.

To this end, the processor 900 may include one or more of a central processing unit (CPU), micro-controller, application processor (AP), communication processor (CP), ARM processor, or the like.

For example, according to an embodiment, the processor 900 may set a pulse width of a driving current according to a pulse width setup voltage, and control the panel driver 800 to set an amplitude of the driving current according to an amplitude setup voltage. In a case that the display panel 1000 and/or 1000' includes n columns and m rows, the processor 900 may control the panel driver 800 to set an amplitude or pulse width of the driving current by the row (by the horizontal line).

Thereafter, the processor 900 may collectively apply a driving voltage (VDD) to the plurality of driving circuits 300 and/or 700 via the current source 320 of the plurality of driving circuits 300 and/or 700, and control the panel driver 800 to apply a linear shift voltage (sweep signal) to a PWM driving circuit 330 of each of the plurality of driving circuits 300 and/or 700, and thereby an image can be displayed.

In this case, the detail of the processor 900 controlling the panel driver 800 to control an operation of the respective driving circuits 300 and/or 700 included in the display panel 1000 and/or 1000' is as described above with reference to FIGS. 7 to 11 and thus, the overlapped description will be omitted.

In the example described above, the processor 900 and the timing controller 810 are separate elements. However, the timing controller 810 may perform a function of the processor 900 without the processor 900.

Figure 13:
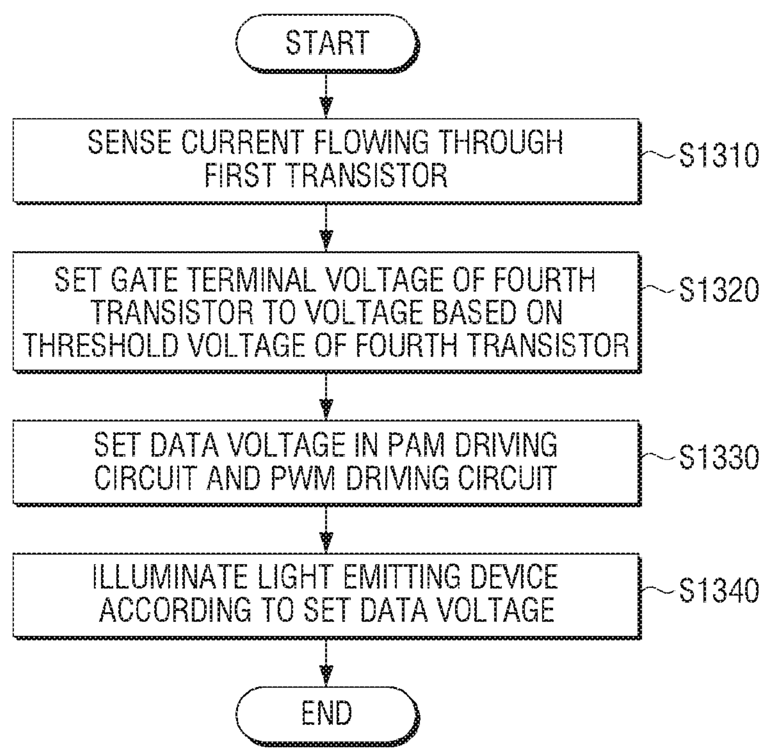
FIG. 13 is a flowchart illustrating a method for driving a display panel, according to an embodiment.

FIG. 13 is a flowchart illustrating a method for driving a display panel, according to an embodiment.

According to an embodiment, the display panel 1000 and/or 1000' may be driven in the order of a sensing duration, a reset duration, a data voltage setup duration, and a light emitting duration for one image frame.

Referring to FIG. 13, the display panel 1000 and/or 1000' may be driven in such a way that a current flowing through the first transistor 325 included in the driving circuit 300 and/or 700 is sensed by an external processor or a timing controller during the sensing duration, at operation S1310.

For example, in the display panel 1000 and/or 1000', when the third transistor 311 of the driving circuit 300 and/or 700 is turned on according to the control signal (SPAM(n)) within the voltage setup duration during the sensing duration, a particular voltage may be charged in the first capacitor 312 of the driving circuit 300 and/or 700 through the data line 5. Thereafter, when the second transistor 340 of the driving circuit 300 and/or 700 is turned on according to the Sense signal within the current sensing duration during the sensed duration, a current corresponding to the particular voltage flowing through the first transistor 325 may be transferred to the data line 5 through the second transistor 340.

The current transferred to the data line 5 as described above may be sensed by an external processor or timing controller connected to the data line 5, and the external processor or the timing controller may correct an amplitude setup voltage to be later applied to the PAM driving circuit 310 of the driving circuit 300 and/or 700 based on the sensed current.

In addition, the display panel 1000 and/or 1000' may be driven so that the gate terminal voltage of the fourth transistor 331 of the driving circuit 300 and/or 700 during the reset duration is set to a voltage based on the threshold voltage of the fourth transistor 331, at operation S1320.

For example, in the display panel 1000 and/or 1000', when the reset duration is started, the fifth transistor 332 of the driving circuit 300 and/or 700 may be turned on according to the RES signal. While the fifth transistor 332 is turned on, the sixth transistor 333 of the driving circuit 300 and/or 700 may be turned on or off according to the Ref signal. Accordingly the gate terminal voltage of the fourth transistor 331 may be set to a predetermined reference voltage while the sixth transistor 333 is turned on during the reset duration (that is, during the initialization duration), and may be set to a voltage based on the threshold voltage of the fourth transistor 331 while the sixth transistor is turned off during the reset duration (that is, during the threshold voltage setup duration).

In addition, the display panel 1000 and/or 1000' may be driven during the data voltage setup duration so that a data voltage is set up in the PAM driving circuit 310 and the PWM driving circuit 330, at operation S1330.

For example, the display panel 1000 and/or 1000' may be, when the seventh transistor 336 of the driving circuit 300 and/or 700 is turned on according to the control signal (SPWM(n)) during the data voltage setup duration, driven so that a pulse width setup voltage applied through the data line 5 is applied to the gate terminal of the fourth transistor 331 through the second capacitor 334 of the driving circuit 300 and/or 700. Accordingly, the gate terminal voltage of the fourth transistor 331 may be set to a voltage based on a threshold voltage and pulse width setup voltage of the fourth transistor 331.

In addition, the display panel 1000 and/or 1000' may be, when the third transistor 311 of the driving circuit 300 and/or 700 is turned on according to the control signal (SPAM(n)) during the data voltage setup duration, driven so that an amplitude setup voltage applied through the data line 5 is charged in the first capacitor 312 of the driving circuit 300 and/or 700. In this case, the amplitude setup voltage applied through the data line 5 may be a voltage which is corrected based on a current flowing through the first transistor 325 sensed during the sensing duration.

In addition, the display panel 1000 and/or 1000' may be, during the light emitting duration, driven so that the light emitting device 200 emits light according to the pulse width setup voltage and the amplitude setup voltage, at operation S1340.

When the light emitting duration is started, a sweep voltage may be applied to one terminal of the second capacitor 334 through the third capacitor 335, and thus the gate terminal voltage of the fourth transistor 331 connected to the other terminal of the second capacitor 334 may be linearly reduced from the maintained voltage (VDD+Vth+Vw) according to the sweep voltage. When the gate terminal voltage of the fourth transistor 331 being linearly reduced reaches the threshold voltage Vth of the fourth transistor 331, the fourth transistor 331 may be turned on, and a driving voltage VDD may be applied to the gate terminal voltage of the first transistor 325 via the eighth transistor 350. Accordingly, when the first transistor 325 is turned off, the driving current may be blocked and the light emitting device 200 stops emitting light. That is, the light emitting device 200 may emit light from a time when a light emitting duration is started until the gate terminal voltage of the fourth transistor 331 is linearly reduced according to a sweep voltage and reaches the threshold voltage Vth of the fourth transistor 331.

In the example described above, the light emitting device 200 is a micro LED, but is not limited thereto. That is, according to an embodiment, even when the light emitting device 200 is an LED of a size greater than or equal to 100 micrometers, the driving circuit 300 and/or 700 according to the various embodiments described above may be applied.

In addition, in the example described above, the display panel 1000 and/or 1000' is a chip-on-glass (COG) type, but according to an embodiment, the driving circuit 300 and/or 700 according to the various embodiments described above may be applied to a display panel of a chip-on-board (COB) type. As for a display panel of a COB type, a substrate is used instead of the glass 100 unlike the COG type. In this case, a hole penetrating the substrate is formed and one surface of the substrate and the other surface of the substrate are electrically connected through the hole, and thereby the driving circuit 300 and/or 700 provided on one surface of the substrate and various circuits provided on the other surface of the substrate can be electrically connected to each other.

According to an embodiment, the display panel 1000 and/or 1000' may be implemented as an independent display panel without extensibility. However, the example is not limited thereto, and the display panel 1000 and/or 1000' may be implemented as an extensible display module included in some of a large-area tiled display.

According to the various embodiments, a wavelength shift according to a grayscale or gradation of a light emitting device included in a display panel can be prevented. In addition, it is possible to correct a stain or color of the light emitting device included in the display panel. In addition, even in a case that a large-area tiled display panel is configured by combining a display panel in the form of a plurality of modules, a difference of brightness or color among the respective modular display panels can be corrected.

The above-described embodiments may be implemented as a software program including an instruction stored on machine (e.g., computer)-readable storage media. The machine is an apparatus which is capable of calling a stored instruction from the storage medium and operating according to the called instruction, and may include a display apparatus 1200 according to the above-described embodiments.

When the command is executed by a processor, the processor may perform a function corresponding to the command directly or using other components under the control of the processor. The command may include a code generated or executed by a compiler or an interpreter. A machine-readable storage medium may be provided in the form of a non-transitory storage medium. Herein, the term "non-transitory" only denotes that a storage medium does not include a signal but is tangible, and does not distinguish the case where data is semi-permanently stored in a storage medium from the case where data is temporarily stored in a storage medium.

According to an embodiment, the method according to the above-described various embodiments may be provided as being included in a computer program product. The computer program product may be traded as a product between a seller and a consumer. The computer program product may be distributed in the form of (e.g., a compact disc read only memory (CD-ROM)) or through an application store (e.g., Playstore™). In the case of online distribution, at least a portion of the computer program product may be at least temporarily stored or temporarily generated in a server of the manufacturer, a server of the application store, or a storage medium such as memory.

Each of the components (e.g., module or program) according to the various embodiments may include a single entity or a plurality of entities, and some of the corresponding sub components described above may be omitted, or another sub component may be further added to the various embodiments. Alternatively or additionally, some components (e.g., module or program) may be combined to form a single entity which performs the same or similar functions as the corresponding elements before being combined. Operations performed by a module, a program, or other component, according to various embodiments, may be sequential, parallel, or both, executed iteratively or heuristically, or at least some operations may be performed in a different order, omitted, or other operations may be added.

Although embodiments of the present disclosure have been illustrated and described, it should be understood that the present disclosure is not limited to the disclosed embodiments and may be variously changed without departing from the spirit and the scope of the present disclosure. While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A display panel comprising:

a glass;

an inorganic light emitting device corresponding to a sub pixel among sub pixels of the display panel; and a driving circuit disposed on the glass and configured to provide a driving current to the inorganic light emitting device and to control an amplitude and a pulse width of the driving current, wherein the inorganic light emitting device is mounted on the driving circuit and electrically connected to the driving circuit, and wherein the driving circuit is provided for each of the sub pixels.

2. The display panel as claimed in claim 1, further comprising:

a plurality of pixels arranged in a matrix form, each pixel from among the plurality of pixels including an R sub pixel including a red (R) inorganic light emitting device, a G sub pixel including a green (G) inorganic light emitting device, and a B sub pixel including a blue (B) inorganic light emitting device; and a plurality of driving circuits configured to provide the driving current to each of the respective red, green, and blue inorganic light emitting devices included in the respective R, G and B sub pixels.

3. The display panel as claimed in claim 2, wherein a data voltage applied to each respective driving circuit from among the plurality of driving circuits to set the amplitude of the driving current is corrected according to a deviation of the respective driving circuit, and wherein each respective driving circuit from among the plurality of driving circuits comprises a plurality of transistors configured to correct a deviation of pulse width of the driving current caused by the deviation of the respective driving circuit.

4. The display panel as claimed in claim 2, wherein each respective driving circuit from among the plurality of driving circuits comprises:

a current source comprising a first transistor connected to the corresponding inorganic light emitting device, the current source being configured to vary a magnitude of the driving current provided to the inorganic light emitting device according to a magnitude of a voltage applied to the first transistor;

a pulse amplitude modulation (PAM) driving circuit configured to apply an amplitude setup voltage to the first transistor, the amplitude setup voltage determining the amplitude of the driving current provided to the first transistor; and a pulse width modulation (PWM) driving circuit configured to control a duration of light emission of the corresponding inorganic light emitting device by controlling the voltage of the first transistor based on a pulse width setup voltage determining the pulse width of the driving current.

5. The display panel as claimed in claim 4, wherein the voltage applied to the first transistor is corrected based on a current flowing through the first transistor while a second transistor connected to the first transistor is turned on.

6. The display panel as claimed in claim 4, wherein each respective PAM driving circuit comprises:

a third transistor including a source terminal connected to a data line, and a drain terminal connected to a gate terminal of the first transistor; and a first capacitor including a first terminal connected to a source terminal of the first transistor, and a second terminal commonly connected to the gate terminal of the first transistor and the drain terminal of the third transistor, and wherein based on the amplitude setup voltage being input through the data line while the third transistor is turned on, the input amplitude setup voltage is charged in the first capacitor, and a voltage charged in the first capacitor is applied to the gate terminal of the first transistor.

7. The display panel as claimed in claim 6, wherein the source terminal of the first transistor is commonly connected to the first terminal of the first capacitor and a driving voltage terminal of the driving circuit, wherein a drain terminal of the first transistor is connected to an anode terminal of the inorganic light emitting device, wherein a cathode terminal of the inorganic light emitting device is connected to a ground voltage terminal of the driving circuit, and wherein while a driving voltage is applied to the driving voltage terminal and the voltage charged in the first capacitor is applied to the gate terminal of the first transistor, and while a voltage of the ground voltage terminal is a ground voltage, the driving current of an amplitude corresponding to a magnitude of the voltage charged in the first capacitor is provided to the inorganic light emitting device.

8. The display panel as claimed in claim 4, wherein the PWM driving circuit comprises a fourth transistor and a fifth transistor connected to a gate terminal of the fourth transistor and a drain terminal of the fourth transistor; and wherein the PWM driving circuit is further configured to control the duration of light emission of the inorganic light emitting device by controlling a gate terminal voltage of the first transistor.

9. The display panel as claimed in claim 8, wherein the fifth transistor is configured to be turned on during a threshold voltage setup duration to set a voltage applied to the gate terminal of the fourth transistor to a first voltage based on a threshold voltage of the fourth transistor.

10. The display panel as claimed in claim 9, wherein the PWM driving circuit comprises:

a sixth transistor including a source terminal connected to a data line, and a drain terminal commonly connected to the gate terminal of the fourth transistor and a source terminal of the fifth transistor;

a second capacitor including a first terminal commonly connected to the gate terminal of the fourth transistor, the source terminal of the fifth transistor, and the drain terminal of the sixth transistor;

a third capacitor including a first terminal receiving a linearly-shifting sweep signal, and a second terminal connected to a second terminal of the second capacitor; and a seventh transistor including a source terminal connected to the data line, and a drain terminal commonly connected to the second terminal of the second capacitor and the second terminal of the third capacitor.

11. The display panel as claimed in claim 10, wherein the pulse width setup voltage is applied by the data line to the source terminal of the seventh transistor, wherein the gate terminal voltage of the fourth transistor reaches, after reaching the first voltage and while the seventh transistor is turned on, a second voltage based on the threshold voltage of the fourth transistor and the pulse width setup voltage, wherein the linearly-shifting sweep signal is applied to the first terminal of the third capacitor, wherein the gate terminal voltage of the fourth transistor is, after reaching the second voltage and based on the linearly-shifting sweep signal being input through the first terminal of the third capacitor, linearly shifted according to the linearly-shifting sweep signal, and wherein the fourth transistor is turned on when the linearly-shifted gate terminal voltage of the fourth transistor reaches the threshold voltage of the fourth transistor.

12. The display panel as claimed in claim 10, wherein the sixth transistor is turned on and off while the fifth transistor is turned on, and wherein the gate terminal voltage of the fourth transistor becomes a reference voltage which is input through the data line when the fifth transistor is turned on and the sixth transistor is turned on, and is shifted from the reference voltage to the first voltage when the fifth transistor is turned on and the sixth transistor is turned off.

13. The display panel as claimed in claim 12, wherein each respective driving circuit among the plurality of driving circuits further comprises:

an eighth transistor including a drain terminal connected to the first transistor, and a source terminal commonly connected to the drain terminal of the fourth transistor and a drain terminal of the fifth transistor, wherein the eighth transistor is turned on while the sixth transistor is turned on, and applies the reference voltage to the gate terminal of the first transistor.

14. The display panel as claimed in claim 8, further comprising a controller configured to, during display of one image frame:

sense a current flowing through the first transistor during a sensing duration;

after the sensing duration, set the gate terminal voltage of the fourth transistor to a first voltage during a reset duration;

after the reset duration, apply the pulse width setup voltage and the amplitude setup voltage to the PWM driving circuit and the PAM driving circuit, respectively, during a data voltage setup duration; and after the data voltage setup duration, drive the inorganic light emitting device to emit a light according to the pulse width setup voltage and the amplitude setup voltage during a light emitting duration.

15. The display panel as claimed in claim 14, wherein the controller is further configured to apply, during the data voltage setup duration, a corrected amplitude setup voltage based on the sensed current flowing through the first transistor during the sensing duration.

16. The display panel as claimed in claim 14, wherein the controller is further configured to sense, during the sensing duration, the current flowing through each respective first transistor included in the plurality of driving circuits for driving inorganic light emitting devices included in a plurality of pixels of at least one horizontal line from among a plurality of lines of a matrix shape.

17. The display panel as claimed in claim 14, wherein the sensing duration includes a voltage setup duration during which the controller is configured to apply a particular voltage to the first transistor, and a current sensing duration during which the controller is configured to sense the current flowing through the first transistor corresponding to the particular voltage, wherein the current flowing through the first transistor during the sensing duration is sensed for different durations within the sensing duration for each of the R, G, and B sub pixels.

18. The display panel as claimed in claim 17, wherein the particular voltage is applied to the first transistor of each of the R, G and B sub pixels for different durations within the voltage setup duration, and wherein a magnitude of the particular voltage applied to the first transistor varies based on a type of the respective inorganic light emitting device.

19. The display panel as claimed in claim 1, wherein the inorganic light emitting device comprises a micro-LED of a size less than or equal to 100 micrometers.

20. A method for driving a display panel, wherein the display panel includes:

a glass;

an inorganic light emitting device; and a driving circuit disposed between the glass and the inorganic light emitting device, the driving circuit being configured to provide a driving current to the inorganic light emitting device and to control an amplitude and a pulse width of the driving current, wherein the inorganic light emitting device is mounted on the driving circuit and electrically connected to the driving circuit, and wherein the driving circuit includes:

a current source comprising a first transistor connected to the inorganic light emitting device, the current source being configured to vary a magnitude of the driving current provided to the inorganic light emitting device according to a magnitude of a voltage applied to the first transistor;

a pulse amplitude modulation (PAM) driving circuit configured to apply an amplitude setup voltage to the first transistor, the amplitude setup voltage determining an amplitude of the driving current provided to the first transistor; and a pulse width modulation (PWM) driving circuit configured to control a duration of light emission of the inorganic light emitting device by controlling the voltage of the first transistor based on a pulse width setup voltage determining the pulse width of the driving current, wherein the method comprises:

sensing a current flowing through the first transistor;

setting a gate terminal voltage of a second transistor included in the PWM driving circuit to a voltage based on a threshold voltage of the second transistor, the second transistor being configured to control a gate terminal voltage of the first transistor;

applying the amplitude setup voltage and the pulse width setup voltage to the PWM driving circuit and the PAM driving circuit, respectively, the amplitude setup voltage and the pulse width setup voltage being corrected based on the sensed current flowing through the first transistor; and illuminating the inorganic light emitting device according to the pulse width setup voltage and the amplitude setup voltage.

* * * * *